United States Patent
Ukaji

(10) Patent No.: US 6,847,132 B2
(45) Date of Patent: Jan. 25, 2005

(54) ELECTROMAGNETIC ACTUATOR HAVING AN ARMATURE COIL SURROUNDED BY HEAT-CONDUCTING ANISOTROPY MATERIAL AND EXPOSURE APPARATUS

(75) Inventor: Takao Ukaji, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 60 days.

(21) Appl. No.: 10/183,594

(22) Filed: Jun. 28, 2002

(65) Prior Publication Data

US 2003/0011254 A1 Jan. 16, 2003

(30) Foreign Application Priority Data

Jul. 10, 2001 (JP) .......................................... 2001-208960

(51) Int. Cl.$^7$ ............................. H02K 9/00; H02K 9/19; H02K 9/22
(52) U.S. Cl. ............................. 310/12; 310/16; 310/52; 310/58; 310/64
(58) Field of Search ............................. 310/12, 16, 52, 310/58, 64

(56) References Cited

U.S. PATENT DOCUMENTS

| | | | | |
|---|---|---|---|---|
| 3,806,782 A | * | 4/1974 | Matsui et al. ................ | 104/282 |
| 3,913,045 A | * | 10/1975 | Von Starck ................... | 336/60 |
| 4,172,229 A | * | 10/1979 | Guimbal ....................... | 310/13 |
| 4,318,038 A | * | 3/1982 | Munehiro ..................... | 318/135 |
| 4,837,467 A | * | 6/1989 | Newman ....................... | 310/12 |
| 4,839,545 A | * | 6/1989 | Chitayat ....................... | 310/12 |
| 5,072,144 A | * | 12/1991 | Saito et al. .................... | 310/12 |
| 5,225,725 A | * | 7/1993 | Shiraki et al. ................. | 310/12 |
| 5,258,671 A | * | 11/1993 | Vollenwyder et al. ......... | 310/12 |
| 5,359,245 A | * | 10/1994 | Takei ............................ | 310/12 |
| 5,565,718 A | * | 10/1996 | Takei ............................ | 310/12 |
| 5,648,691 A | * | 7/1997 | Takei ............................ | 310/12 |
| 5,675,195 A | * | 10/1997 | Takei ............................ | 310/12 |
| 5,696,411 A | * | 12/1997 | Takei ............................ | 310/12 |
| 5,701,042 A | * | 12/1997 | Takei ............................ | 310/12 |
| 5,703,417 A | * | 12/1997 | Kelly ........................... | 310/12 |
| 5,783,877 A | * | 7/1998 | Chitayat ....................... | 310/12 |
| 5,808,381 A | * | 9/1998 | Aoyama et al. ............... | 310/12 |
| 6,084,319 A | * | 7/2000 | Kamata et al. ................ | 310/12 |
| 6,107,703 A | * | 8/2000 | Korenaga ...................... | 310/12 |
| 6,326,708 B1 | * | 12/2001 | Tsuboi et al. .................. | 310/12 |
| 6,437,463 B1 | * | 8/2002 | Hazelton et al. .............. | 310/12 |
| 6,490,498 B1 | * | 12/2002 | Takagi .......................... | 700/159 |
| 6,495,934 B1 | * | 12/2002 | Hayashi et al. ............... | 310/12 |
| 6,496,858 B1 | * | 12/2002 | Frailong et al. ............... | 709/221 |
| 6,528,907 B2 | * | 3/2003 | Hwang et al. ................. | 310/12 |
| 6,570,273 B2 | * | 5/2003 | Hazelton ....................... | 310/12 |
| 6,590,355 B1 | * | 7/2003 | Kikuchi et al. ............... | 318/135 |
| 6,700,227 B2 | * | 3/2004 | Hartramph ..................... | 310/12 |
| 6,713,902 B2 | * | 3/2004 | Chitayat ........................ | 310/12 |
| 6,713,903 B2 | * | 3/2004 | Widdowson et al. ......... | 310/12 |
| 6,717,294 B2 | * | 4/2004 | Chuo ............................ | 310/12 |
| 6,717,295 B2 | * | 4/2004 | Hwang et al. ................. | 310/12 |

FOREIGN PATENT DOCUMENTS

| | | | | |
|---|---|---|---|---|
| JP | 2505857 | 4/1996 | | |
| JP | 2661092 | 6/1997 | | |
| JP | 10-127035 | 5/1998 | | |
| JP | 10-309071 | 11/1998 | | |
| JP | 11027927 A | * 1/1999 | .......... | H02K/41/02 |
| JP | 11-122900 | 4/1999 | | |
| JP | 2001327152 A | * 11/2001 | .......... | H02K/41/02 |
| JP | 2002238238 A | * 8/2002 | .......... | H02K/41/02 |
| WO | WO 2063749 A1 | * 8/2002 | .......... | H02K/41/02 |

* cited by examiner

Primary Examiner—Joseph Waks
Assistant Examiner—Pedro J. Cuevas
(74) Attorney, Agent, or Firm—Fitzpatrick, Cella, Harper & Scinto

(57) ABSTRACT

An electromagnetic actuator has a permanent magnet and an armature coil that performs relative movement with respect to the permanent magnet. A material having heat conduction anisotropy surrounds a surface of the armature coil and a heat radiating member radiates heat generated by the armature coil. The heat conduction anisotropic material is oriented to guide the heat generated from the armature coil to the heat radiating member. The actuator may be used in one or more groups of semiconductor substrate exposure apparatuses in a manufacturing factory that performs plural processes using the group of manufacturing apparatuses.

26 Claims, 23 Drawing Sheets

FIG.24

URL [http://www.maintain.co.jp/db/input_html]

TROUBLE-DB INPUT PICTURE FRAME

| | |
|---|---|
| DATE OF GENERATION | 2000/3/15 — 404 |
| APPARATUS TYPE | * * * * * * * * * — 401 |
| ITEM NAME | FAILURE IN OPERATION (ERROR AT STARTING) — 403 |
| APPARATUS S/N | 465NS4580001 — 402 |
| URGENCY | D — 405 |
| SYMPTOM | THE LED CONTINUES TO FLASH AFTER TURNING ON THE POWER SUPPLY. — 406 |
| COUNTERMEASURE | RESTART THE POWER SUPPLY (DEPRESS THE RED BUTTON WHEN STARTING THE POWER SUPPLY) — 407 |
| PROGRESS | PROVISIONAL ACTION PERFORMED. — 408 |

[TRANSMIT] [RESET]

410 — LINK TO RESULT-SUMMARY DATABASE

411 — SOFTWARE LIBRARY

412 — OPERATIONAL GUIDE

ELECTROMAGNETIC ACTUATOR HAVING AN ARMATURE COIL SURROUNDED BY HEAT-CONDUCTING ANISOTROPY MATERIAL AND EXPOSURE APPARATUS

BACKGROUND OF THE INVENTION

1. Field of the Invention

The present invention relates to an electromagnetic actuator, such as a linear motor or the like, including a stator and a movable element, an exposure apparatus including the electromagnetic actuator, a device manufacturing method using the exposure apparatus, a device manufacturing factory in which the exposure apparatus is installed, and a method for performing maintenance of the exposure apparatus.

2. Description of the Related Art

Typical conventional exposure apparatuses used for manufacturing various devices, such as semiconductor devices, are step-and-repeat-type exposure apparatuses (also called "steppers") which sequentially expose a plurality of exposure regions on a substrate (a wafer or a glass substrate) with a pattern of an original plate (a reticle or a mask) via a projection optical system while moving the substrate stepwise, and step-and-scan-type exposure apparatuses (also called "scanners") which repeat exposure and transfer on a plurality of regions on a substrate by repeating stepwise movement and scanning exposure. Since the step-and-scan-type exposure apparatuses use only light relatively close to the optical axis of the projection optical system by limiting the light beam by a slit, more precise fine-pattern exposure with a wider angle of view can be performed.

Each of these exposure apparatuses includes stage devices (a wafer stage and a reticle stage) for positioning a wafer and a reticle while moving them at a high speed. A linear pulse motor (a linear motor) using a Lorentz force is usually used for driving such a stage. By using a linear motor, a movable unit and a fixed unit of a stage are subjected to high-speed driving in a non-contact state, and very precise positioning can be performed.

Recently, the acceleration of the stage has increased in accordance with an increase in the speed of positioning processing (improvement of throughput). For example, in step-and-scan-type exposure apparatuses, the maximum acceleration of the stage now reaches values of $5\times 9.81$ m/s$^2$ (5 G) for reticle stages, and $1\times 9.81$ m/s$^2$ (1 G) for wafer stages. Furthermore, in accordance with an increase in the sizes of reticles and wafers, the mass of the stage is also increasing. Accordingly, the driving force defined by (the mass of a moving body)×(acceleration) becomes very large, resulting in an increase in the calorific value of a linear motor for driving a stage, and the influence of generated heat from the motor on its surroundings is causing a problem.

Conventionally, in order to suppress heat generation from a coil, a refrigerant is caused to flow in the vicinity of the coil. In a linear motor described in Japanese Patent Publication No. 2505857, cooling is performed by causing a refrigerant to flow within a member for supporting both ends of an armature coil. In a linear motor described in Japanese Patent Publication No. 2661092, it is intended to reduce heat conduction to a moving body by mounting a permanent magnet via a heat insulator. In the linear motors described in Japanese Patent Application Laid-Open (Kokai) Nos. 10-127035 (1998), 10-309071 (1998) and 11-122900 (1999), an armature coil is directly immersed in a refrigerant, in order to improve the cooling efficiency.

FIGS. 2 and 3 are cross-sectional views, each illustrating the structure of such a conventional linear motor. In FIG. 2, reference numeral 1 represents an armature coil of a linear motor. A bar-shaped supporting member 2 having an H-shaped cross section holds a plurality of armature coils 1 arranged in a direction vertical to the plane of FIG. 2. A refrigerant 3 flows within both side portions of the supporting member 2 in a longitudinal direction. A filler 4 covers the surfaces of the armature coils 1. A permanent magnet 5 forms a magnetic field for the linear motor. A yoke 6 provides a magnetic circuit with the permanent magnet 5 and a magnetic field generated by the armature coil 1. In FIG. 3, components having the same reference numerals as in FIG. 2 have the same functions. As shown in FIGS. 2 and 3, the armature coils 1 are cooled by the refrigerant 3 flowing within the supporting member 2 at both side portions. In the configuration shown in FIG. 2, by covering the entirety of the armature coils 1 with the supporting member 2, and inserting the filler 4 between the supporting member 2 and the armature coils 1 except for a portion near the refrigerant 3, heat conduction from the surfaces of the armature coils 1 to the outside of the linear motor is prevented. In the configuration shown in FIG. 3, two bar-shaped supporting members 2 support only both side portions of armature coils 1 arranged in a direction perpendicular to the plane of FIG. 3.

In the manufacture of semiconductor devices, in order to improve productivity, it is necessary to perform abrupt acceleration and deceleration when positioning a reticle and a wafer for exposure. In order to increase the thrust of a linear motor, serving as an actuator for the positioning, it is necessary to increase one of the volume of the entirety of the linear motor, the magnetic flux density of the magnet, and the current of the armature coil. However, since the volume cannot be increased due to a limitation in design, and there is a limitation in the magnetic flux density due to the physical properties of the magnetic material, the current of the armature coil must be increased. In this case, the thrust increases in proportion to the current, while heat due to copper loss is in proportion to the square of the current. Accordingly, the necessary cooling capability also increases. The heat transfer capability to the refrigerant at that time is determined by the contact area, physical properties (thermal conductivity, specific heat and specific gravity), the temperature difference and the flow rate. Since the contact area and the physical properties are determined by the structure and the material, the range of selection is small. Accordingly, it is necessary to increase the temperature difference between the armature coil and the refrigerant, or the flow rate of the refrigerant.

In the above-described conventional linear motors, since heat generated at the armature coil is not completely transmitted to the refrigerant, the surface temperatures of the armature coils and a jacket surrounding the armature coils are raised, thereby causing unevenness in the temperature of ambient air. Furthermore, in contrast to rotation-type motors, linear motors have a configuration in which at least a coil jacket must be exposed to air. In an environment requiring high precision for a semiconductor manufacturing apparatus or the like, since unevenness in the temperature of air degrades accuracy during a positioning operation, it is difficult to increase the thrust of a linear motor.

In linear motors described in Japanese Patent Application Laid-Open (Kokai) Nos. 10-127035 (1998), 10-309071 (1998) and 11-122900 (1999), in order to minimize the above-described temperature rise, armature coils are directly immersed in a refrigerant. In such a case, however, it is necessary to sufficiently insulate the armature coils, or use an insulating liquid as the refrigerant. If it is intended to increase the flow rate of the refrigerant in order to increase the cooling capability, since the resistance of a duct line increase as the flow rate increases, the pressure within the duct line increases. In order to reduce the resistance of a magnetic circuit, a thinner structure material for covering the surfaces of the armature coils is preferred. However, since a thickness sufficient enough to endure the pressure of the refrigerant is required in the above-described linear motors, there is the possibility that the thrust of the motor decreases in spite of the intension to increase it.

SUMMARY OF THE INVENTION

It is an object of the present invention to provide an electromagnetic actuator, such as a linear motor or the like, in which the thrust of the motor is increased while suppressing a rise in the surface temperature of an armature coil.

It is another object of the present invention to provide an exposure apparatus in which positioning processing during exposure is performed at a high speed, throughput is improved, very precise positioning is performed, and exposure of a fine pattern can be performed, a device manufacturing method using the exposure apparatus, a semiconductor manufacturing factory including the exposure apparatus, and a method for performing maintenance of the exposure apparatus.

According to one aspect of the present invention, an electromagnetic actuator includes a permanent magnet, an armature coil capable of performing relative movement with respect to the permanent magnet, a material having heat-conduction anisotropy that surrounds the armature coil, and a heat radiating member for radiating heat generated from the armature coil.

In one embodiment, it is preferable that the material having heat-conduction anisotropy is oriented so as to guide the heat generated from the armature coil to the heat radiating member.

In another embodiment, it is preferable to further include a material whose thermal conductivity is lower than thermal conductivity of the material having heat-conduction anisotropy in a direction of thickness, between the material having heat-conduction anisotropy and the coil.

In still another embodiment, it is preferable that the material having heat-conduction anisotropy is a material having a smaller eddy-current loss than a metal.

In yet another embodiment, it is preferable that the material having heat-conduction anisotropy is a graphite sheet.

In yet a further embodiment, it is preferable that the material having heat-conduction anisotropy is brought in tight contact with the heat radiating member by an adhesive whose thermal conductivity is higher than the thermal conductivity of the material having heat-conduction anisotropy in a direction of thickness.

In still another embodiment, it is preferable that the heat radiating member is connected to cooling means provided outside of the linear motor, so as to conduct the heat to the cooling means.

In still another embodiment, it is preferable that the heat radiating member is a heat radiating plate.

In still another embodiment, it is preferable that the heat radiating member is a duct line for causing a refrigerant to flow therewithin.

In still another embodiment, it is preferable that an inner-wall material of the duct line is a nonmagnetic material.

In still anther embodiment, it is preferable that the material having heat-conduction anisotropy contacts the refrigerant flowing within the duct line.

In still another embodiment, it is preferable to further include a supporting member for supporting the armature coil.

In still another embodiment, it is preferable that heat conductivity of the supporting member is 200–400 W/m K.

In still another embodiment, it is preferable that the material having heat-conduction anisotropy is brought in tight contact with a surface of the supporting member by an adhesive whose thermal conductivity is higher than thermal conductivity of the material having heat-conduction anisotropy in a direction of thickness.

In still another embodiment, it is preferable that the supporting member includes a pair of bar-shaped members extending in a direction of movement and fixed in parallel to each other, and supports the armature coil by grasping the armature coil between the pair of bar-shaped members.

In still another embodiment, it is preferable that the duct line for causing the refrigerant to flow therewithin passes within the supporting member.

In still another embodiment, it is preferable that an inner-wall material of the duct line has a thermal conductivity higher than the thermal conductivity of the supporting member.

According to another aspect of the present invention, an exposure apparatus for exposing a substrate with a pattern of an original plate includes a stage for moving the original plate or the substrate. The stage includes a permanent magnet, an armature coil capable of performing relative movement with respect to the permanent magnet, a material having heat-conduction anisotropy that surrounds the armature coil, and a heat radiating member for radiating heat generated from the armature coil.

According to still another aspect of the present invention, a device manufacturing method includes a step of installing a group of manufacturing apparatuses for respective processes inclusive of the above-described exposure apparatus in a device manufacturing factory, and a step of manufacturing a device according to a plurality of processes using the group of manufacturing apparatuses.

According to yet another aspect of the present invention, a device manufacturing factory includes a group of manufacturing apparatuses for respective processes inclusive of the above-described exposure apparatus, a local area network connecting the group of manufacturing apparatuses, and a gateway for allowing access from the local area network to an external network provided outside of the factory. In the factory, data communication of information relating to at least one of the group of manufacturing apparatuses is allowed.

According to still another aspect of the present invention, a method for performing maintenance of the above-described exposure apparatus installed in a device manufacturing factory includes a step of providing a maintenance database connected to an external network of the device manufacturing factory from a vender or a user of the exposure apparatus, a step of permitting access to the maintenance database from the semiconductor manufacturing factory via the external network, and a step of transmitting maintenance information accumulated in the maintenance database to the device manufacturing factory via the external network.

According to the present invention, by using a material having heat-conduction anisotropy for a coil jacket, it is possible to transmit heat generated from an armature coil in a specific direction, and increase the thrust of a motor while suppressing a rise of the surface temperature of the armature coil. By orienting the material having heat-conduction anisotropy so as to conduct the heat generated from the armature coil to a radiating member, heat conduction to the radiating member is higher than heat conduction from the armature coil to air.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 24 illustrates a specific example of a user interface;

DETAILED DESCRIPTION OF THE PREFERRED EMBODIMENTS

Figure 1:
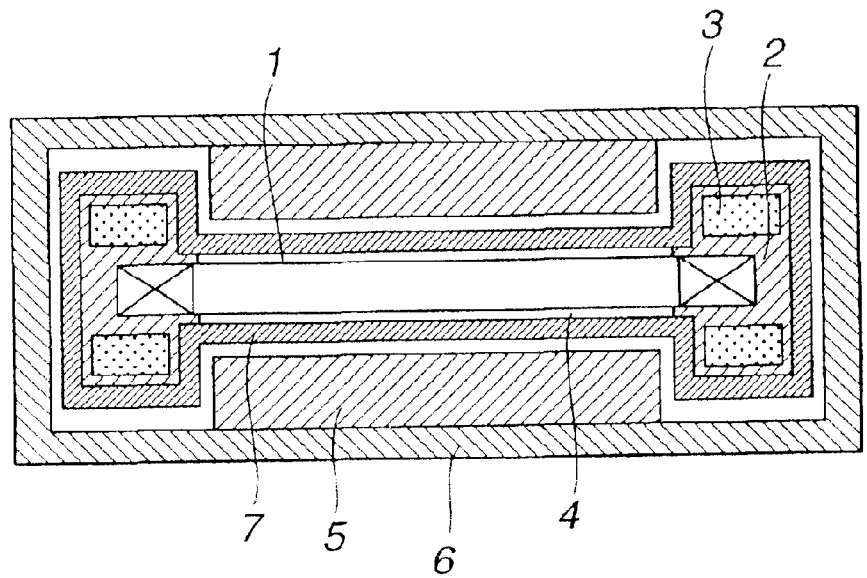
FIG. 1 is a schematic, cross-sectional diagram illustrating a linear motor according to a first embodiment of the present invention.
Figure 2:
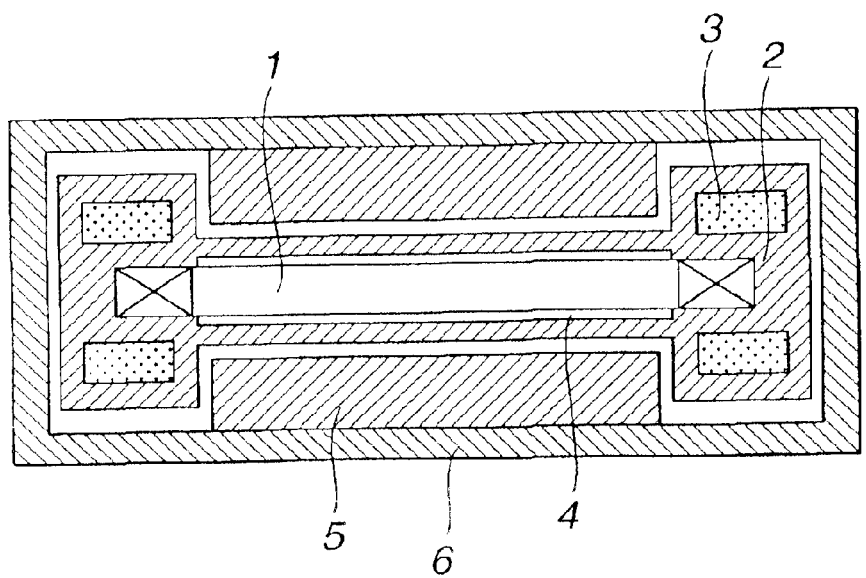
FIG. 2 is a schematic, cross-sectional diagram illustrating a conventional linear motor.
Figure 3:
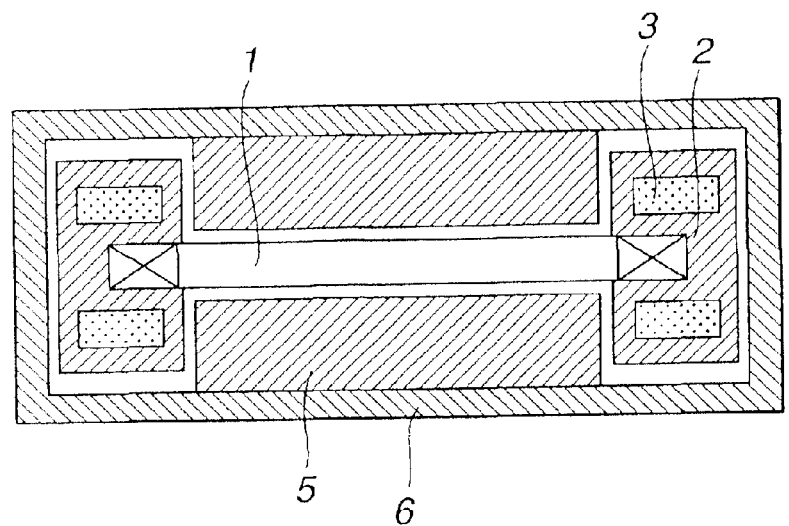
FIG. 3 is a schematic, cross-sectional diagram illustrating another conventional linear motor.

Preferred embodiments of the present invention will now be described.

In an electromagnetic actuator according to each of the preferred embodiments of the present invention, it is preferable that a material having heat-conduction anisotropy comprises fibers of graphite or the like. In this case, while thermal conductivity in the direction of the fibers is high, thermal conductivity in other directions is relatively low. Accordingly, by arranging the direction of the fibers to a direction from a coil to a heat radiating member, heat to be conducted from the coil to external air is efficiently guided to the heat radiating member. A graphite sheet suitable as the material having heat-conduction anisotropy can be manufactured, for example, by removing hydrogen, oxygen and nitrogen in a resin sheet and accelerating crystallization of graphite by heating the resin sheet at a very high temperature (3,000° C.). Heat-conduction anisotropy in the graphite sheet manufactured according to the above-described method differs between the direction of thickness of the sheet and other directions, and thermal conductivity is completely the same in all directions within the plane of the sheet.

It is preferable to fix the material having heat-conduction anisotropy in tight contact with the heat radiating member, using an adhesive whose thermal conductivity is higher than thermal conductivity of the material having heat-conduction anisotropy in the direction of thickness, because thermal resistance is reduced.

By providing a coil jacket obtained by inserting a material whose thermal conductivity is lower than the thermal conductivity of the material having heat-conduction anisotropy in the direction of thickness between the material having heat-conduction anisotropy and the coil, the amount of heat conducted from the coil to the surface of the jacket is reduced, and the heat quantity transmitted to supporting members provided at both sides of the coil is increased. Furthermore, by directly immersing the material having heat-conduction anisotropy in a refrigerant flowing within a duct line, heat conduction to the refrigerant is improved because the contact area with the refrigerant is increased.

A material having a smaller eddy-current loss than a metal is preferable as the material having heat-conduction anisotropy. In order to provide thermal conductivity with anisotropy, a material obtained by laminating a metal having good thermal conductivity (copper) and a metal having inferior thermal conductivity may be used. However, by using a material whose electric conductivity is inferior to the electric conductivity of a metal, such as a graphite sheet or the like, the eddy-current loss can be reduced.

For example, a heat radiating plate, or a duct line for causing a refrigerant to flow therewithin may be used as the heat radiating member of the invention. However, since the heat radiating member is preferably connected to cooling means provided outside of the linear motor in order to conduct heat to the cooling means, a duct line for the refrigerant is usually used as the heat radiating member.

When providing a duct line for the refrigerant as the heat radiating member, the material having heat-conduction anisotropy is brought in contact with the refrigerant flowing at the surface of or within the duct line by an adhesive whose thermal conductivity is higher than thermal conductivity of the material having heat-conduction anisotropy in the direction of thickness. Usually, the duct line passes through the inside of a supporting member for supporting an armature coil, and the inner wall of the duct line is desirably made of a nonmagnetic material whose thermal conductivity is higher than the thermal conductivity of the supporting member. At that time, the material having heat-conduction anisotropy is in tight contact with the surface of the supporting member, i.e., the surface of the duct line. If the supporting member is impermeable to the refrigerant, the duct line may be merely a hole carved in the supporting member.

Preferred embodiments of the present invention will now be described with reference to the drawings.

First Embodiment

Figure 4:
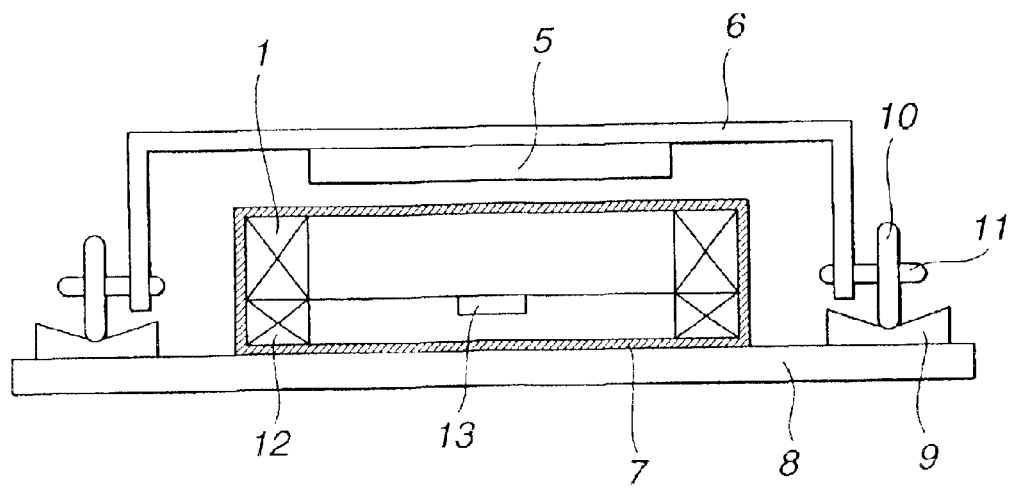
FIG. 4 is a schematic, side view illustrating a linear motor according to a second embodiment of the present invention.

FIGS. 1 and 4 show the first embodiment. FIG. 1 is a schematic cross-sectional view illustrating a linear motor, obtained by cutting the linear motor at a plane vertical to the direction of movement, according to a first embodiment of the present invention.

In FIG. 1, a coil 1 serves as an armature of the linear motor. A supporting member 2 supports the armature coil 1. A refrigerant 3 flows within the supporting member 2. A filler 4 covers the surface of the armature coil 1. A permanent magnet 5 generates a magnetic field for the linear motor. A yoke 6 provides a magnetic circuit with the magnetic field generated by the permanent magnet 5 and the armature coil 1. A material having heat-conduction anisotropy 7 comprises a graphite sheet or the like. The supporting member 2 comprises a pair of bar-shaped members extending in the direction of movement and fixed parallel to each other, and supports the armature coil 1 between the pair of bar-shaped members.

The operation of the linear motor according to the first embodiment will now be described with reference to FIG. 1. When a current is supplied from a power supply (not shown) to the armature coil 1, a thrust is generated between the armature coil 1 and the permanent magnet 5 in a direction perpendicular to the plane of FIG. 1 by the magnetic field generated by the permanent magnet 5 and the yoke 6. At the same time, heat proportional to the square of the current is generated by the DC resistance of the coil 1.

The heat is mainly transmitted through the coil 1, and further to the supporting member 2. The coil 1 is made by insulating a copper wire or the like with enamel or the like. The thermal conductivity of the coil 1 is reduced from the thermal conductivity of copper (about 400 W/m·K), because an insulator, such as enamel or the like, is mixed therewith. For example, if it is assumed that the space factor of copper is 80%, and the thermal conductivity of enamel is 1 W/m·K, the thermal conductivity of the coil 1 is expressed by:

$$1/\{(1/400)\cdot 0.8+(1/1)\cdot 0.2\}=1/(0.032+0.2)=4.32 \text{ W/m·K}.$$

The thermal conductivity of the coil 1 is also anisotropic, i.e., high in a circumferential direction and low in a radial direction. The filler 4 covering the surface of the coil 1 has a thermal conductivity of about 1 W/m·K even for a material whose thermal conductivity is relatively high, such as epoxy resin or the like. Hence, the heat is conducted to the supporting member 2.

Since the supporting member 2 is made of a heat-conductive nonmagnetic material (copper, aluminum or the like), the thermal conductivity of the supporting member 2 is high (200–400 W/m·K). Hence, the heat transmitted from the coil 1 is transmitted to the entirety of the supporting member 2.

The supporting member 2 contacts the refrigerant 3 flowing within the supporting member 2, so that the heat from the supporting member 2 is transmitted to the refrigerant 3. The thermal conductivity of the refrigerant 3 is 0.6 W/m·K in the case of pure water. The thermal conductivity of Florinat (trade name: made by 3M Corporation) is about 1/10 of that of pure water. Hence, in consideration of the temperature difference between the refrigerant 3 and the supporting member 2, it is advantageous to use pure water. The heat is transmitted from the supporting member 2 to the refrigerant 3 in proportion to the temperature difference between the refrigerant 3 and the supporting member 2. Both end portions of a refrigerant channel are connected via cooling means (not shown), and the refrigerant 3 cooled by the cooling means circulates within the channel.

The heat from the coil 1 is also transmitted to the filler 4, and further to the material having heat-conduction anisotropy 7. Within the material having heat-conduction anisotropy 7, thermal conductivity in the lateral direction in FIG. 1 is very large (600–800 W/m·K), and thermal conductivity in a longitudinal direction is much smaller (5 W/m·K). Hence, the heat flowing from the filler 4 mostly flows in the lateral direction. Since the material having heat-conduction anisotropy 7 is brought in tight contact with the supporting member 2, the heat flowing from the material having heat-conduction anisotropy 7 enters the supporting member 2, and is then transmitted to the refrigerant 3.

Since the thermal conductivity of air has a lower value of 0.026 W/m·K compared with the material having heat-conduction anisotropy 7, conduction of the heat from the surface to air is small. In addition, since heat transmission from the material having heat-conduction anisotropy 7 in the lateral direction is excellent, the surface temperature of the linear motor becomes substantially constant, and the unevenness in the temperature is small.

When the permanent magnet 5 is moved by the thrust, an eddy current is generated if a conductive material is present at the armature coil 1. The generated eddy current hinders relative movement between the permanent magnet 5 and the armature coil 1, to perform a braking operation. However, if the material having heat-conduction anisotropy 7 comprises fibers of graphite or the like, and the orientation of the fibers is arranged in the lateral direction in FIG. 1, the eddy current is not generated even if graphite is conductive, because electric conductivity is also anisotropic.

In the first embodiment, the material having heat-conduction anisotropy 7 is brought in tight contact with the supporting member 2. However, if the material having heat-conduction anisotropy 7 is caused to be directly immersed in the refrigerant 3 flowing within the supporting member 3, the surface temperature can be closer to the temperature of the refrigerant 3. In this case, it is desirable to adopt a configuration in which the contact area with the refrigerant 3 is as large as possible. The thermal conductivity of the filler 4 between the coil 1 and the material having heat-conduction anisotropy 7 is not necessarily high. In an extreme case, a void may suffice if the strength is sufficient. Furthermore, the material having heat-conduction anisotropy 7 does not necessarily comprise a single layer. By providing the material having heat-conduction anisotropy 7 with a plurality of layers of another filler, such as an adhesive and the like, the effect of heat-conduction anisotropy is further enhanced.

As described above, according to the first embodiment, by surrounding the surface of the armature coil 1 of the linear motor, including the permanent magnet 5 capable of performing relative movement, the armature coil 1, the bar-shaped supporting member 2 for fixing both ends of the armature coil 1, and the nonmagnetic duct line, made of a material having excellent thermal conductivity, for causing the refrigerant 3 to flow within the supporting member 2, with the material having heat-conduction anisotropy 7 having a small eddy-current loss, heat conduction from the armature coil 1 to air, the duct line, and the refrigerant 3 is improved compared with heat conduction from the armature coil 1 to air. As a result, the influence of the heat from the armature coil 1 on air is reduced. In a condition in which the influence on air is the same, if the flow rate of the refrigerant 3 is sufficient and a large current can flow, the thrust can be further increased in a linear motor having the same outer shape.

When the material having heat-conduction anisotropy 7 comprises fibers of graphite or the like, by arranging the orientation of the fibers to the direction from the armature coil 1 to the duct line, the heat to be transmitted from the armature coil 1 to air is more efficiently guided to the refrigerant 3 in the duct line, thereby reducing the influence on air.

By excellently bonding the material having heat-conduction anisotropy 7 in tight contact with the duct line by an adhesive having high thermal conductivity, the thermal resistance is reduced, so that the heat to be transmitted from the armature coil 1 to air is more efficiently guided to the refrigerant 3 within the duct line, thereby reducing the influence on air.

By directly immersing the material having heat-conduction anisotropy 7 in the refrigerant 3 flowing within the duct line, the contact area with the refrigerant 3 becomes large. Hence, the heat to be transmitted from the armature coil 1 to air is more efficiently guided to the refrigerant 3 within the duct line, thereby reducing the influence on air.

By providing a coil jacket obtained by inserting a material whose thermal conductivity is lower than the thermal conductivity of the material having heat-conduction anisotropy 7 between the material having heat-conduction anisotropy 7 and the armature coil 1, the amount of heat conducted from the armature coil 1 to the surface of the coil jacket is reduced, thereby reducing the influence on air.

By using a material whose electric conductivity is inferior to the electric conductivity of a metal, such as a graphite sheet or the like, as the material having heat-conduction anisotropy 7, instead of a material obtained by laminating a metal (copper) having good thermal conductivity and a material having inferior thermal conductivity, an eddy-current loss is not generated.

The configuration of the first embodiment, such as a back-yoke-type linear motor and the like, also has the same effects in the following embodiments.

Second Embodiment

FIG. 4 is a schematic cross-sectional view illustrating a moving-magnet-type linear motor, obtained by cutting the linear motor at a plane vertical to the direction of movement, according to a second embodiment of the present invention. As shown in FIG. 4, in the linear motor of the second embodiment, an armature coil 1 and a rail 9 are fixed on a surface plate 8, and a yoke 6 mounting a permanent magnet 5 moves on the surface plate 8 in directions perpendicular to the plane of FIG. 4. Rollers 10 are rotatably supported on respective shafts 11 at both sides of the yoke 6 with respect to the direction of movement, whereby the yoke 6 performs rectilinear movement on the rail 9. A magneto-electric transducer 13 for position detection and a magneto coil 12 for speed control are provided on the surface plate 8. By movement of the permanent magnet 5, a voltage is generated in the magneto coil 12. The speed of the linear motor is controlled by inputting this voltage to a control circuit.

In the linear motor of the second embodiment, the armature coil 1, a material having heat-conduction anisotropy 7, the surface plate 8, the rail 9, the magneto coil 12 and the magnet-electric transducer 13 constitute a fixed unit, and the permanent magnet 5, the yoke 6, the rollers 10 and the shafts 11 constitute a movable unit.

The material having heat-conduction anisotropy 7 has high thermal conductivity in a direction perpendicular to the plane of FIG. 4, and transmits heat from the armature coil 1 to heat radiating members (not shown) disposed at both ends in the direction of movement.

As in the first embodiment, in the second embodiment, a structure may also be adopted in which bar-shaped supporting members are provided at both side portions of the armature coil 1, and a refrigerant is caused to flow within the supporting members. In this case, the material having heat-conduction anisotropy 7 covers a duct line for the refrigerant, and is oriented so as to have higher thermal conductivity in a lateral direction in FIG. 4.

Third Embodiment

A linear motor according to a third embodiment of the present invention is the same as the linear motor of the second embodiment, except that a mechanism for optically detecting the speed is provided instead of the magneto coil 12.

Figure 5:
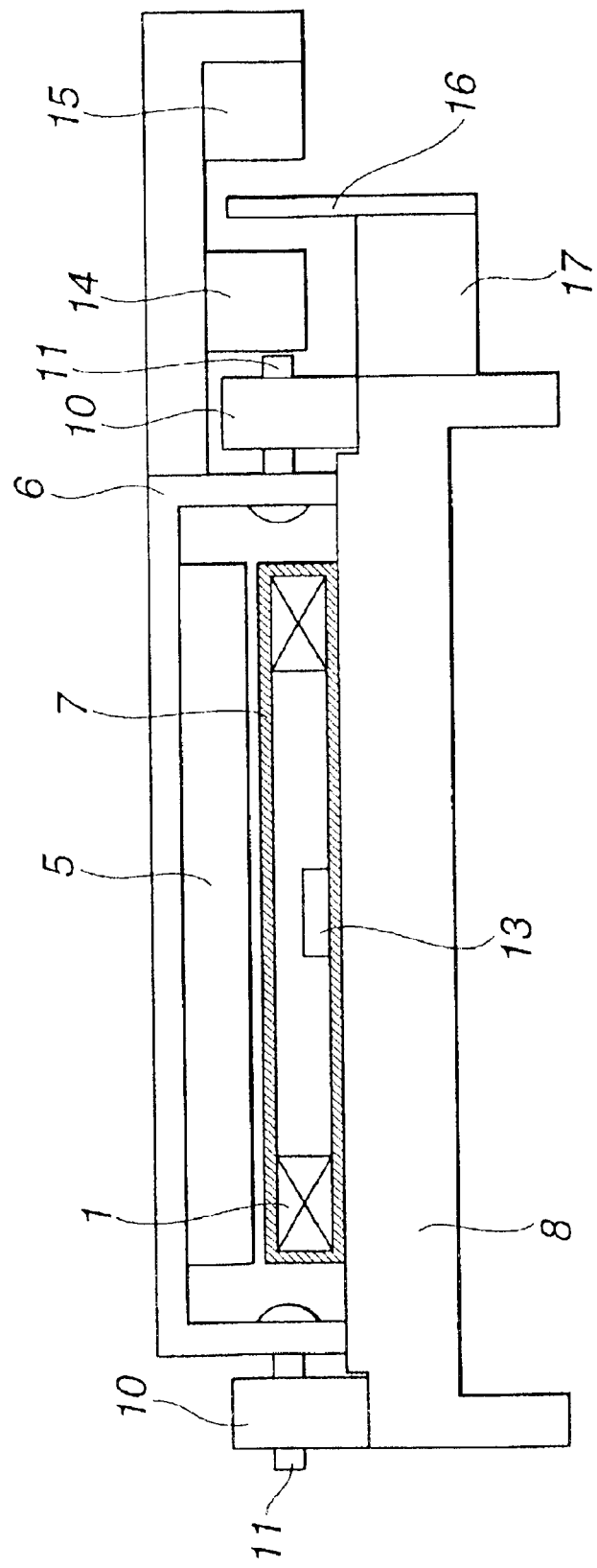
FIG. 5 is a schematic, side view illustrating a linear motor according to a third embodiment of the present invention.

FIG. 5 is a schematic cross-sectional view illustrating a moving-magnet-type linear motor, obtained by cutting the linear motor at a plane vertical to the direction of movement, according to a third embodiment of the present invention. In FIG. 5, there are shown inclined reflecting surfaces 14 and 15. Light from a light-emitting device (not shown) fixed on a surface plate 8 is reflected at the inclined reflecting surface 14, and is then guided to the inclined reflecting surface 15 via a slit provided in a main scale 16. The light is then reflected at the inclined reflecting surface 15, and is then guided to a photosensor (not shown) fixed on the surface plate 8 together with the light-emitting device. The main scale 16 is a strip member extending parallel to the direction of movement of the linear motor, and is made of an opaque material. A large number of slits are provided in the main scale 16 at equal intervals in the direction of movement of the linear motor, in order to detect the velocity of the linear motor from the switching speed of light and dark images on the photosensor.

In FIG. 5, a movable unit (including a permanent magnet 5, a yoke 6, rollers 10, a shaft 11, and the inclined reflecting surfaces 14 and 15) also moves in directions perpendicular to the plane of FIG. 5.

A material having heat-conduction anisotropy 7, a heat radiating member for an armature coil 1, and the like are the same as in the first embodiment.

Fourth Embodiment

Figure 6:
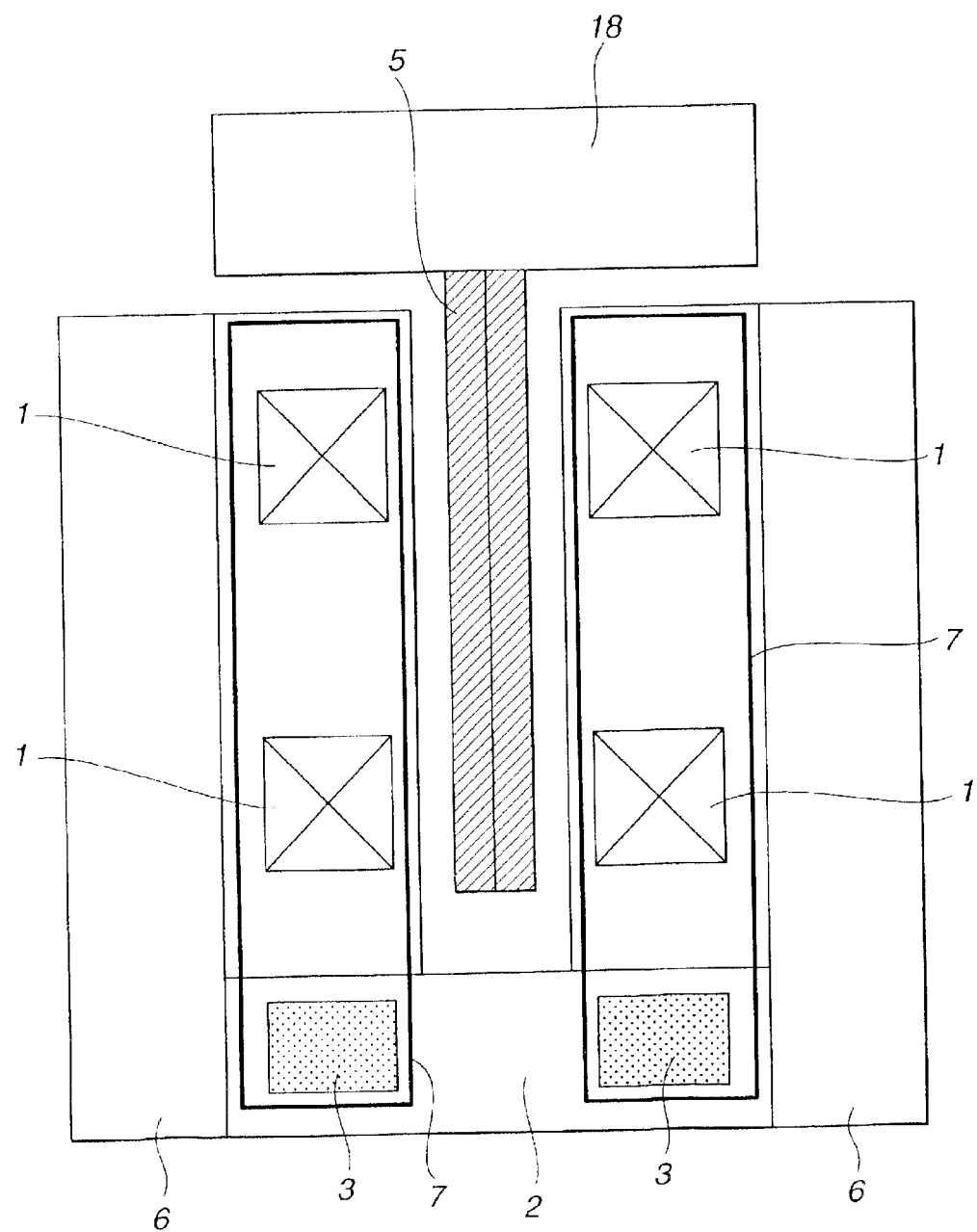
FIG. 6 is a schematic, front view illustrating a linear motor according to a fourth embodiment of the present invention.

FIG. 6 is a diagram illustrating a back-yoke-type moving-magnet-type linear motor according to a fourth embodiment of the present invention. As in FIGS. 1–5, FIG. 6 schematically illustrates a cross section obtained by cutting the linear motor at a plane perpendicular to the direction of movement of the linear motor. As shown in FIG. 6, in the linear motor of the fourth embodiment, a permanent magnet 5 mounted on a sliding member 18 moves in directions perpendicular to the plane of FIG. 6 in a non-contact state between a pair of yokes 6 mounting a plurality of pairs of coils 1. In the fourth embodiment, a refrigerant 3 flows within a supporting member 2 in a direction parallel to the direction of movement of the linear motor. A material having heat-conduction anisotropy 7 covers the coils 1 and the refrigerant 3, and is oriented so that thermal conductivity is higher in a vertical direction in FIG. 6.

Fifth Embodiment

Figure 7:
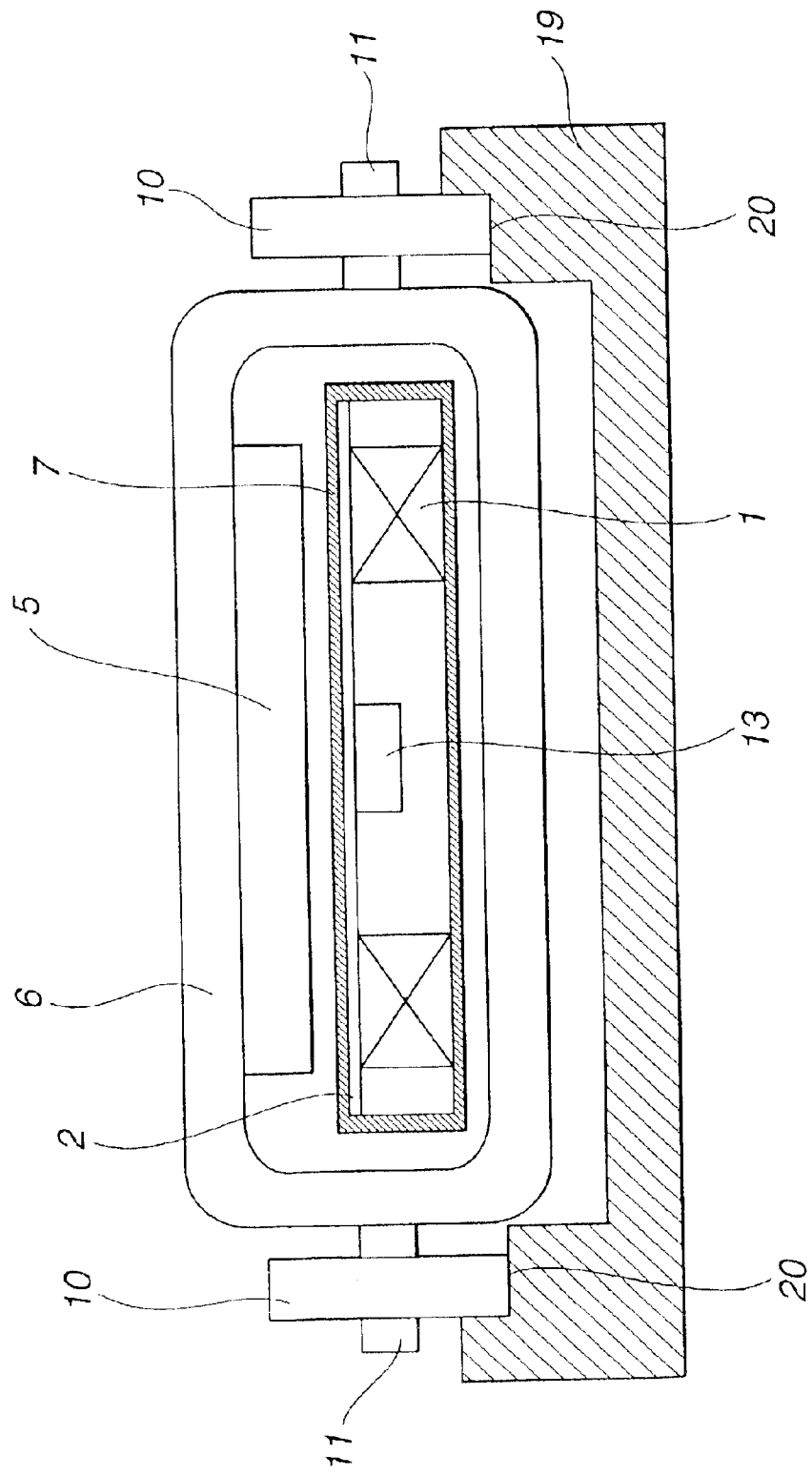
FIG. 7 is a schematic-side view, partially in cross-section, illustrating a linear motor according to a fifth embodiment of the present invention.

FIG. 7 is a diagram illustrating another moving-magnet-type linear motor according to a fifth embodiment of the present invention. As in FIGS. 1–6, FIG. 7 schematically illustrates a cross section obtained by cutting the linear motor at a plane perpendicular to the direction of movement of the linear motor. As shown in FIG. 7, in the linear motor of the fifth embodiment, a permanent magnet 5 is fixed at a central portion of the upper inner surface of a tubular yoke 6 whose cross section is substantially rectangular, and rollers 10 are rotatably mounted on a shaft 11 fixed at both sides of the yoke 6. On a long supporting member 2 made of a nonmagnetic material, a plurality of armature coils 1 are arranged in a longitudinal direction, and a Hall sensor 13 for position detection is provided between the armature coils 1. The entirety of the armature coils 1, the supporting member 2 and the Hall sensors 13 is covered with a material having heat-conduction anisotropy 7. The supporting member 2 is fixed on a frame (not shown) at both end portions in the direction of movement of the linear motor, so as to be parallel to a guide rail 19 whose cross section is stepwise. The rollers 10 rotatably slide on guide portions 20 of the guide rail 19, to move the yoke 6 in directions perpendicular to the plane of FIG. 7.

In the linear motor of the fifth embodiment, a fixed unit including the armature coils 1, the supporting member 2, the material having heat-conduction anisotropy 7, and the Hall sensors 13 is positioned above the guide rail 19, and is threaded through the yoke 6 in a non-contact state.

The material having heat-conduction anisotropy 7, a heat radiating member for the armature coils 1, and the like are the same as in the second through fourth embodiments.

Sixth Embodiment

Figure 8:
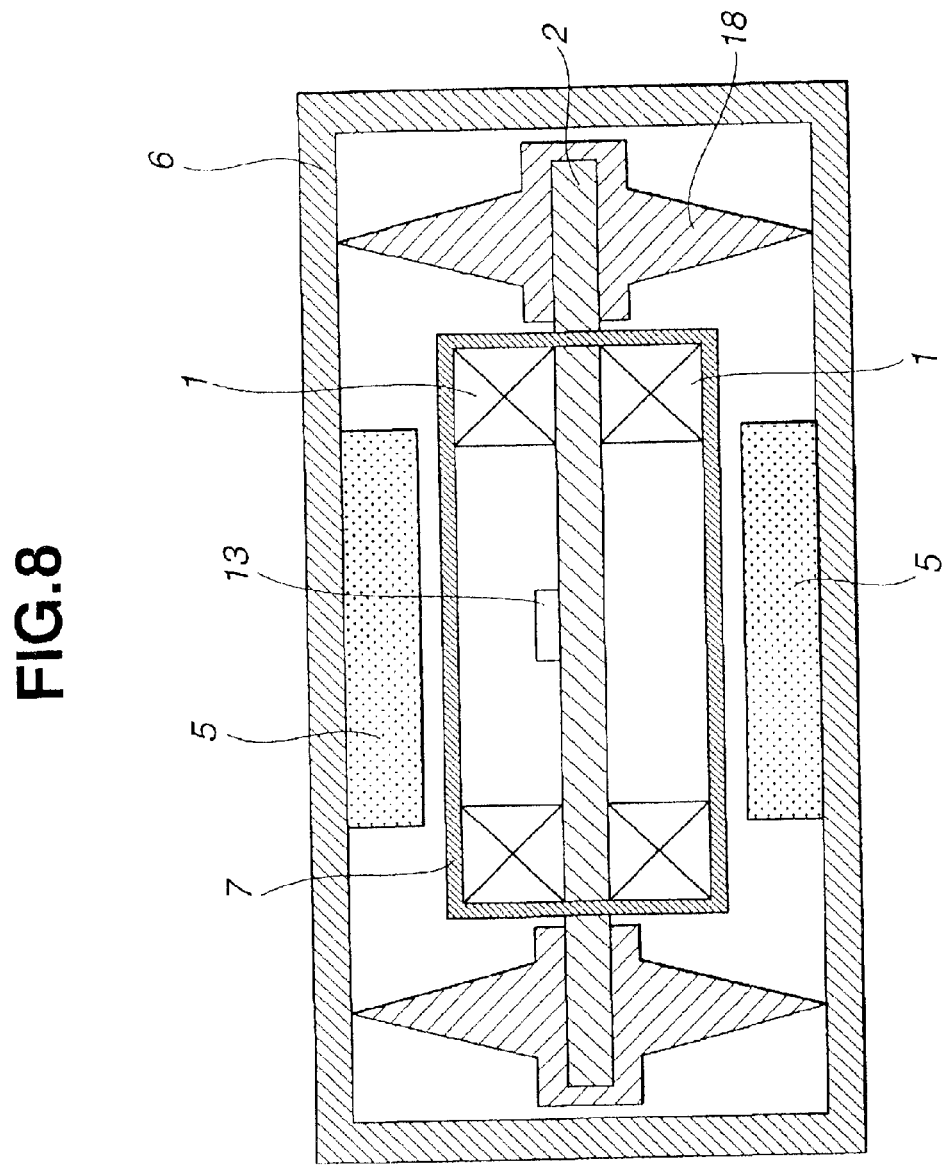
FIG. 8 is a schematic, side view illustrating a linear motor according to a sixth embodiment of the present invention.

FIG. 8 is a schematic cross-sectional view illustrating a moving-coil-type linear motor, obtained by cutting the linear motor at a plane vertical to the direction of movement, according to a sixth embodiment of the present invention. As shown in FIG. 8, in the linear motor of the sixth embodiment, a plurality of pairs of permanent magnets 5 are arranged at upper and lower inner surfaces of a tubular yoke 6 whose cross section is rectangular. A pair of armature coils 1 are fixed on the upper and lower surfaces of a plate-shaped supporting member 2. By sliding movement of sliding members 18 fixed at both side ends of the supporting member 2 at inner upper and lower portions of the tubular yoke 6, the sliding members 18 move in directions perpendicular to the plane of FIG. 8.

In the linear motor of the sixth embodiment, the armature coils 1, the supporting member 2, a material having heat-conduction anisotropy 7, a magneto-electric transducer 13 and the sliding members 18 constitute a movable unit, and the permanent magnets 5 and the yoke 6 constitute a fixed unit.

The material having heat-conduction anisotropy 7 has high thermal conductivity in a direction perpendicular to the plane of FIG. 8, and transmits heat from the armature coils 1 to a heat radiating member (not shown) disposed at both ends in the direction of movement.

As in the first embodiment, in the sixth embodiment, a structure may also be adopted in which a refrigerant flows within the supporting member 2. In this case, the material having heat-conduction anisotropy 7 covers a refrigerant duct line of the supporting member 2, and is oriented so as to have high thermal conductivity in the direction of the duct line. The duct line is connected at both end portions in the direction of movement by a tube which is flexible to a degree so as not to cause a problem in driving of the linear motor.

Seventh Embodiment

Figure 9:
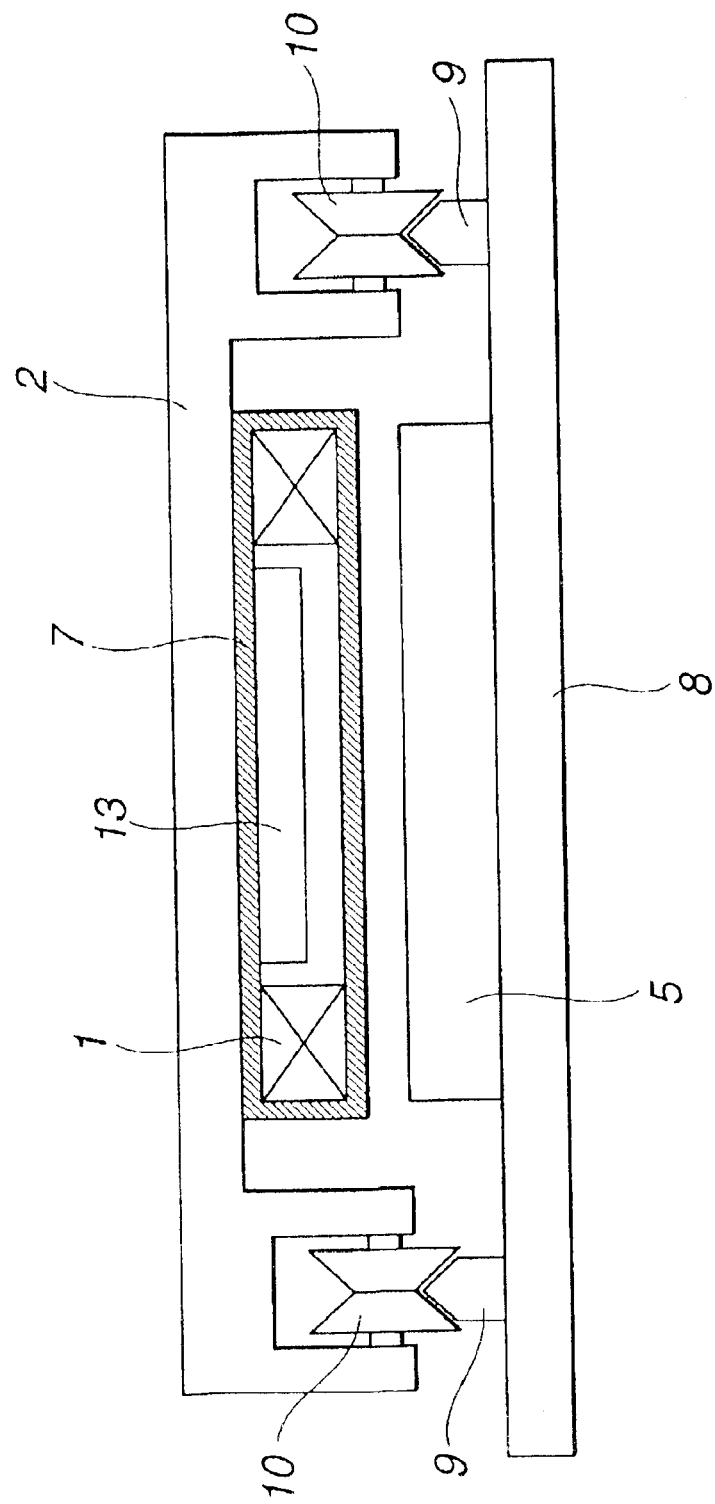
FIG. 9 is a schematic, side view illustrating a linear motor according to a seventh embodiment of the present invention.

FIG. 9 is a diagram illustrating another moving-coil-type linear motor according to a seventh embodiment of the present invention. As FIG. 8, FIG. 9 schematically illustrates a cross section obtained by cutting the linear motor at a plane perpendicular to the direction of movement of the linear motor. As shown in FIG. 9, in the linear motor of the seventh embodiment, a permanent magnet 5 and rails 9 are fixed on a surface plate 8, and a supporting member 2 mounting an armature coil 1 moves on the surface plate 8 in directions perpendicular to the plane of FIG. 9. Rollers 10 are rotatably supported at both sides of the supporting member 2 in the direction of movement of the supporting member 2, whereby the supporting member 2 performs rectilinear movement on the rail 9. A magneto-electric transducer 13 for position detection is provided on the supporting member 2. A material having heat-conduction anisotropy 7, and a heat radiating member for the armature coil 1 are the same as in the sixth embodiment.

Eighth Embodiment

Figure 10:
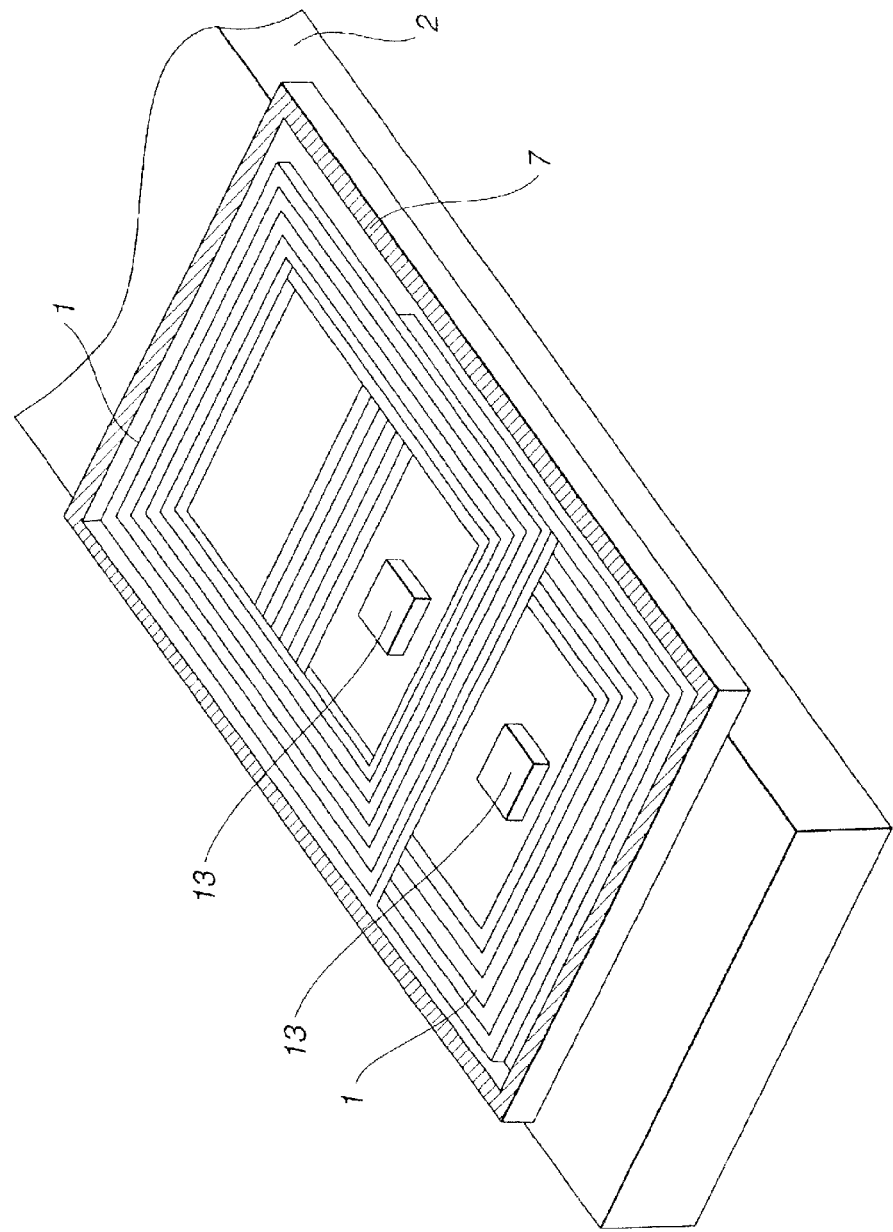
FIG. 10 is a cut away perspective view illustrating a linear motor according to an eighth embodiment of the present invention.

A linear motor according to an eighth embodiment of the present invention is the same as in the seventh embodiment, except that armature coils 1 are arranged in a superposed state. FIG. 10 is a partially sectional perspective view of a movable unit of the linear motor of the eighth embodiment.

Ninth Embodiment

Figure 11:
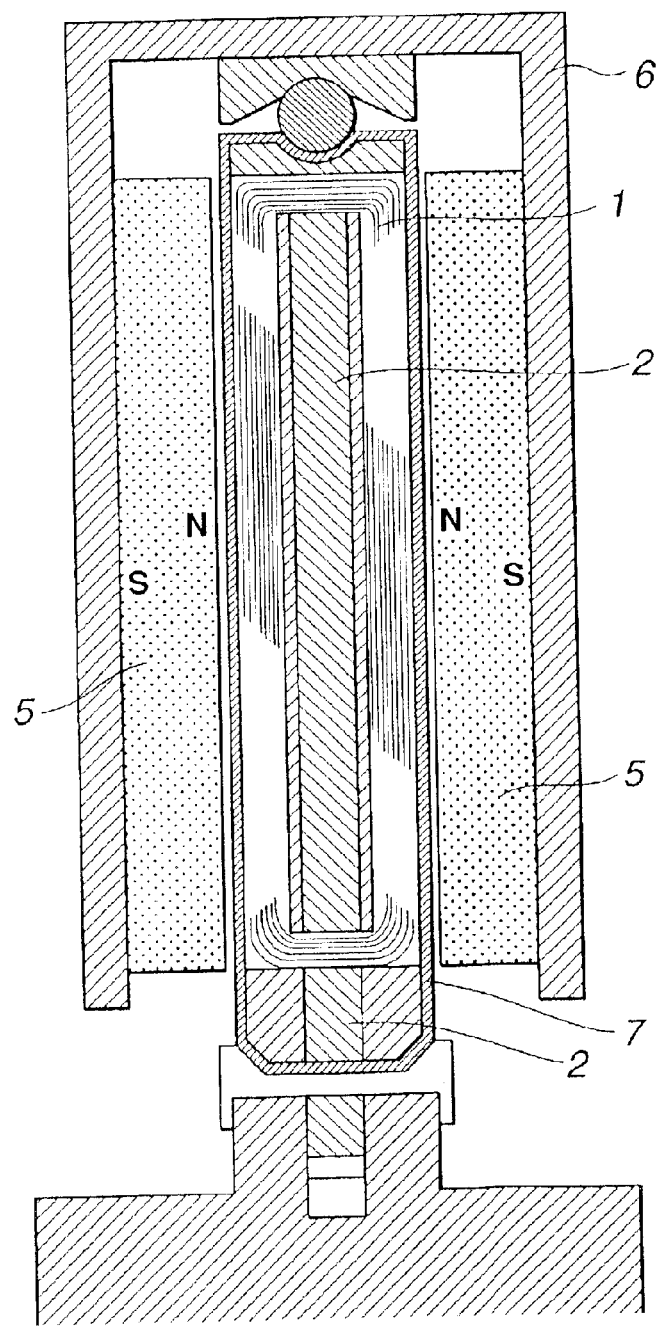
FIG. 11 is a schematic, cross-sectional view illustrating a linear motor according to a ninth embodiment of the present invention.

FIG. 11 is a diagram illustrating still another moving-coil-type linear motor according to a ninth embodiment of the present invention. As FIGS. 8 and 9, FIG. 11 schematically illustrates a cross section obtained by cutting the linear motor at a plane perpendicular to the direction of movement of the linear motor. As shown in FIG. 11, in the linear motor of the ninth embodiment, an armature coil 1 disposed between a plurality of pairs of permanent magnets 5 that are disposed at both ends in the moving direction in a non-contact state, and fixed on a supporting member 2 moves in directions perpendicular to the plane of FIG. 11 by performing sliding movement with respect to a yoke 6, serving as a fixed unit.

A material having heat-conduction anisotropy 7, and a heat radiating member for the armature coil 1 are the same as in the sixth and seventh embodiments.

Tenth Embodiment

Figure 12:
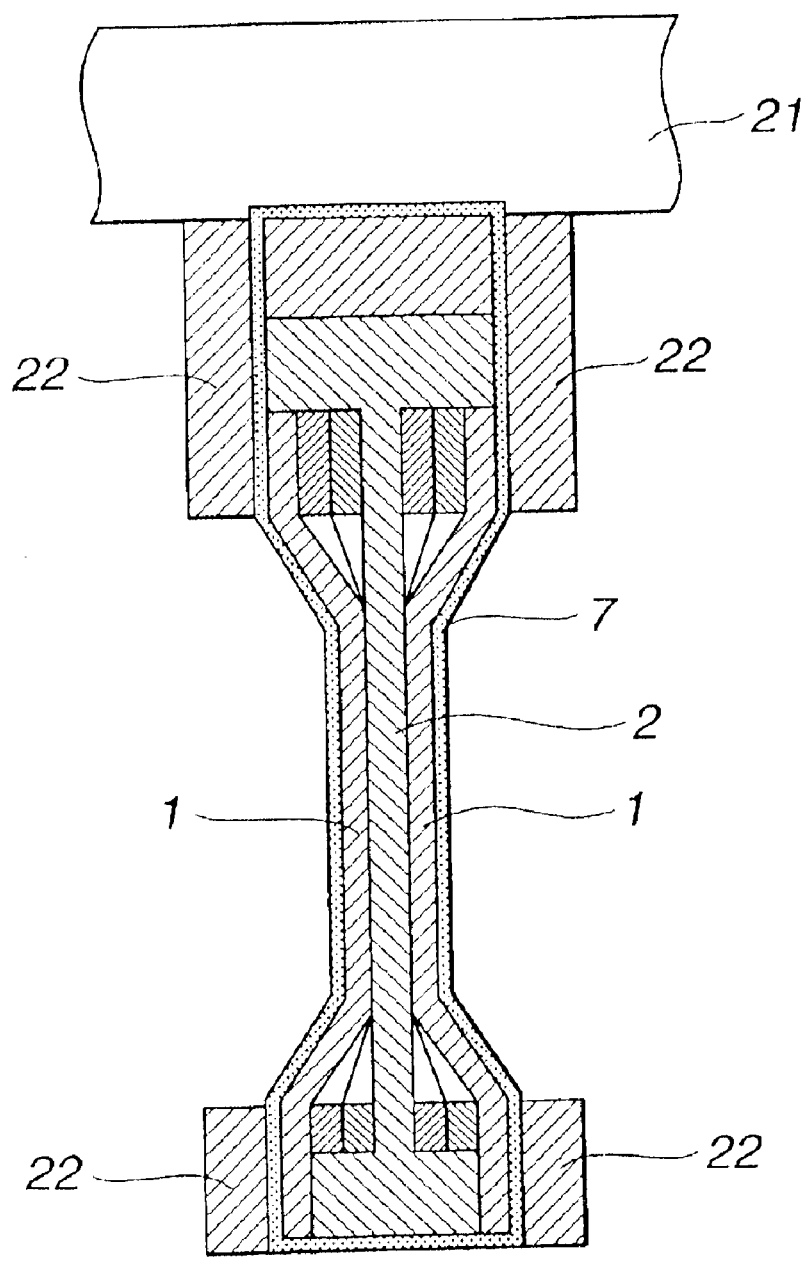
FIG. 12 is a schematic, partially cross-sectional front view illustrating a linear motor according to a tenth embodiment of the present invention.

As in the ninth embodiment, in a tenth embodiment of the present invention, a pair of permanent magnets are provided so as to grasp sides of armature coils 1. FIG. 12 schematically illustrates a cross section obtained by cutting a moving unit of a linear motor of the tenth embodiment at a plane perpendicular to the direction of movement. As shown in FIG. 12, a supporting member 2 and armature coils 1 wound on the supporting member 2 are coated with a material having heat-conduction anisotropy 7, and are fixed on a sliding plate 21 sliding on a fixed unit (not shown). Heat radiating plates 22 are fixed at portions near upper and lower ends of the armature coils 1, in order to radiate heat generated from the armature coils 1. The material having heat-conduction anisotropy 7 is oriented so as to provide higher thermal conductivity in a vertical direction, and is bonded to the heat radiating plate 22 by an adhesive whose thermal conductivity is higher than thermal conductivity of the material having heat-conduction anisotropy 7 in the direction of thickness, to conduct the heat from the armature coils 1 to the heat radiating plate 22.

Eleventh Embodiment

Figure 13:
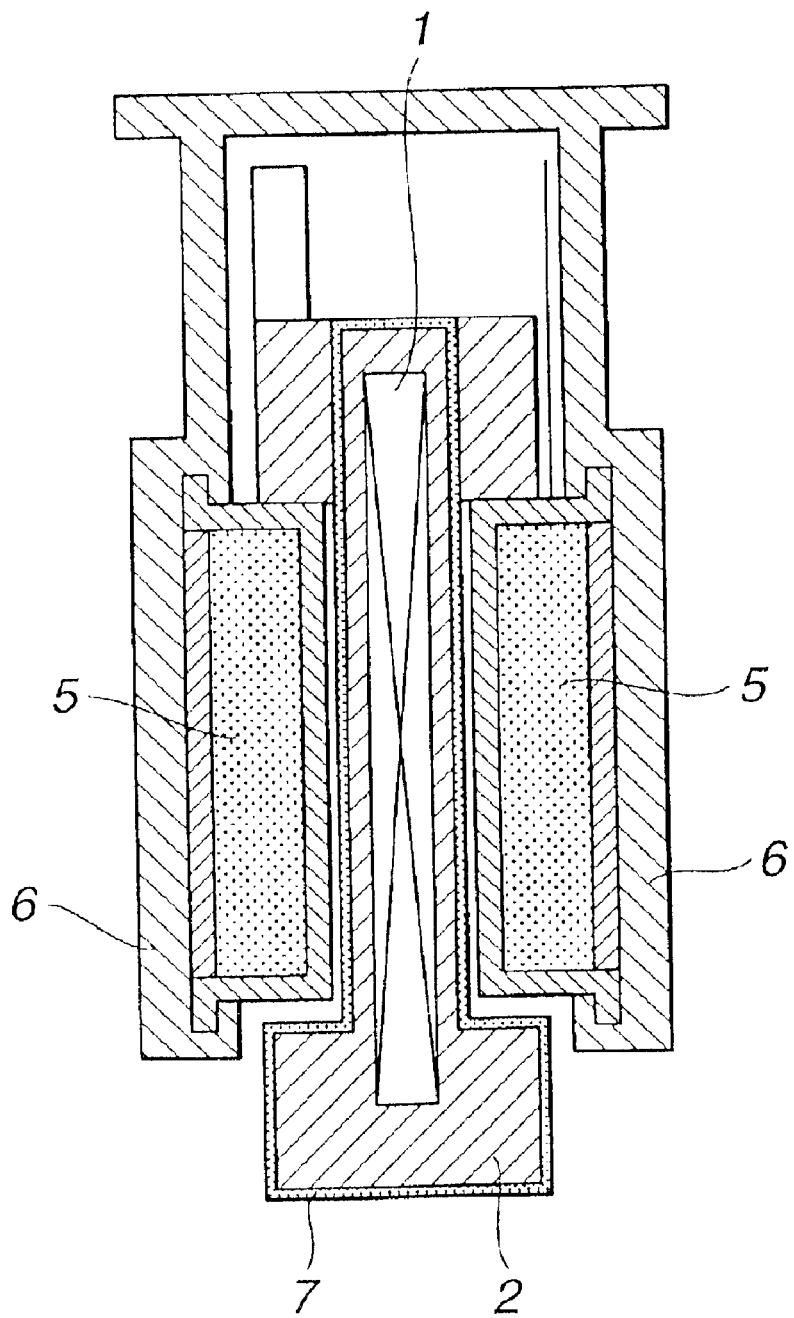
FIG. 13 is a schematic, cross-sectional view illustrating a linear motor according to an eleventh embodiment of the present invention.

In the above-described ninth and tenth embodiments, the pair of permanent magnets provided at both sides of the armature coil are disposed so that the directions of the magnetic fields are inverse to each other. In an eleventh embodiment of the present invention, however, a pair of permanent magnets 5 provided to grasp an armature coil 1 are disposed so as to provide the same direction of magnetic field. FIG. 13 schematically illustrates a cross section obtained by cutting a moving-magnet-type linear motor of the eleventh embodiment at a plane perpendicular to the direction of movement of the linear motor.

The material having heat-conduction anisotropy 7 and a radiating member for the armature coil 1 are the same as in the above-described sixth through tenth embodiments.

Twelfth Embodiment

Figure 14:
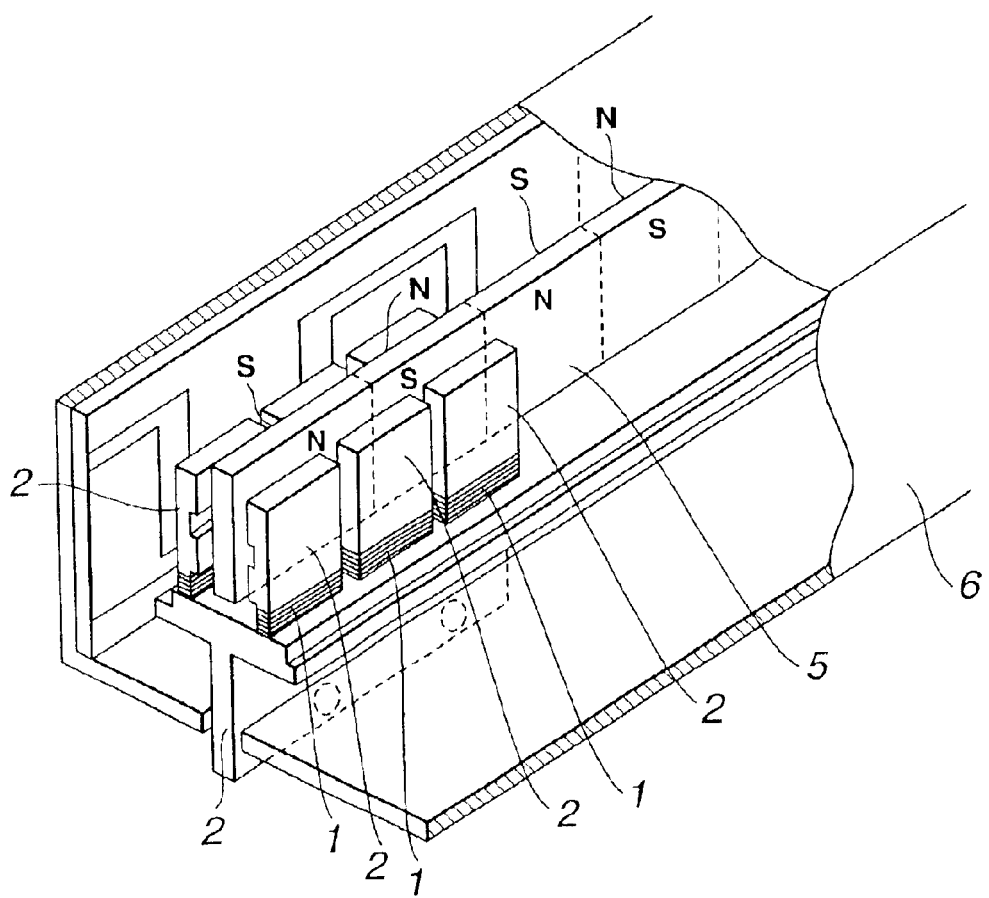
FIG. 14 is a partially cutaway perspective view illustrating a linear motor according to a twelfth embodiment of the present invention.

FIG. 14 is a perspective view illustrating still another moving-coil-type linear motor according to a twelfth embodiment of the present invention. As shown in FIG. 14, in the linear motor of the twelfth embodiment, respective three bobbin units face three bobbin units on a supporting member 2, and an armature coil 1 is wound around each of the bobbin units. At a central portion between the facing bobbin units, a plurality of permanent magnets 5 are arranged in the direction of movement in a non-contact state. These permanent magnets 5 are supported at an upper central portion of the inner surface of a tubular yoke 6. A movable unit including the supporting member 2 and the six armature coils 1 moves along a guide opened in the shape of a slit in the longitudinal direction of the yoke 6.

A material having heat-conduction anisotropy (not shown) and a radiating member for the armature coils 1 are the same as in the above-described sixth through eleventh embodiments.

Thirteenth Embodiment

Figure 15:
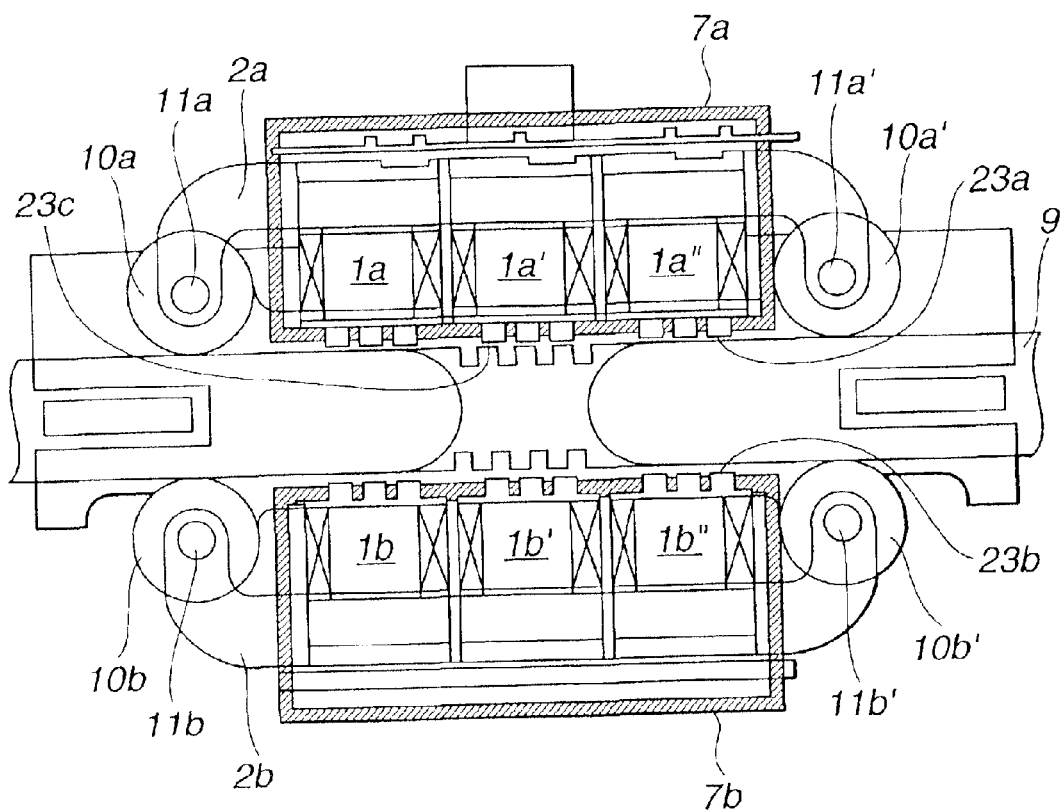
FIG. 15 is a schematic, side view illustrating a linear motor according to a thirteenth embodiment of the present invention.

FIG. 15 is a schematic diagram illustrating a linear pulse motor, as seen from a side portion with respect to the direction of movement of the motor, according to a thirteenth embodiment of the present invention. In the linear motor of the thirteenth embodiment, a movable unit is subjected to stepwise driving along a pair of parallel rails 9 (one of the rails is not shown) provided at both sides of a fixed unit. In stepwise driving, teeth 23a and 23b provided at the movable unit and corresponding teeth 23c formed by cutting a permanent magnet that are positioned between the pair of rails 9 precisely mesh and perform relative movement. In the movable unit, a pair of units are connected so as to grasp the rails 9 from above and below, so as to compensate variations in the thickness of the rails 9. One of the units that is positioned above the rails 9 includes three armature coils 1a (1a, 1a', 1a") arranged in the direction of movement, a material having heat-conduction anisotropy 7a covering the three armature coils 1a, and four rollers 10a (only 10a and 10a' are shown) rotatably mounted on shafts 11a (11a, 11a') at four corners of a supporting member 2a, comprising a magnetic laminated member, for supporting the above-described members. Similarly, another one of the units positioned below the rails 9 includes armature coils 1b, a material having heat-conduction anisotropy 7b, shafts 11b, and rollers 10b at four corners. The material having heat-conduction anisotropy 7 has higher thermal conductivity in a direction perpendicular to the plane of FIG. 15, and transmits heat from the armature coils 1 to a heat radiating member (not shown) disposed at both side portions in the direction of movement.

As in the first embodiment, in the thirteenth embodiment, a structure may also be adopted in which a refrigerant flows within the supporting member 2. In this case, the material having heat-conduction anisotropy 7 covers a refrigerant duct line of the supporting member 2, and is oriented so as to have high thermal conductivity in the direction of the duct line. The duct line is connected at both end portions in the direction of movement by a tube which is flexible to a degree of not causing a problem in driving of the linear motor.

Fourteenth Embodiment

Figure 16:
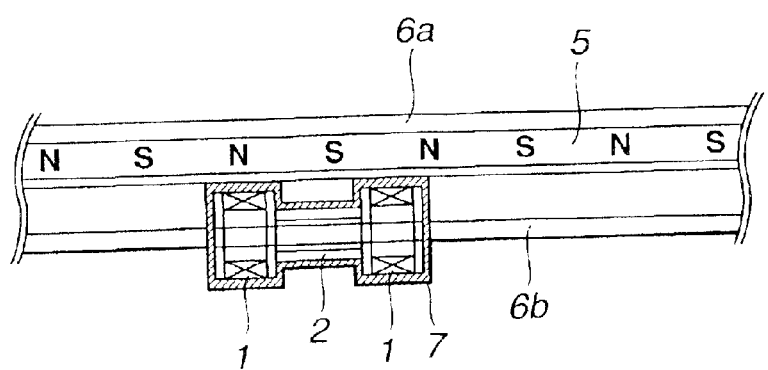
FIG. 16 is a schematic, side view illustrating a linear motor according to a fourteenth embodiment of the present invention.

FIG. 16 is a schematic cross-sectional view illustrating a voice-coil-type linear motor, obtained by cutting the linear motor at a plane parallel to the direction of movement, according to a fourteenth embodiment of the present invention. As shown in FIG. 16, in the linear motor of the fourteenth embodiment, yokes 6 (6a, 6b) fixed at end portions (not shown) so that a pair of long slips are parallel to each other, a plurality of permanent magnets 5 arranged in the longitudinal direction of one of the long yokes 6a, and the shaft yoke 6b fixed in parallel to the ling yoke 6a constitute a fixed unit. A supporting member 2, two voice coils 1, serving as armature coils, connected by the supporting member 2, and a material having heat-conduction anisotropy 7 covering the entirety of the voice coils 1 constitute a movable unit. The supporting member 2 is tubular with a cross section of substantially a rectangle, and slides along the shaft yoke 6b threaded through the supporting member 2. The material having heat-conduction anisotropy 7 has higher thermal conductivity in a direction perpendicular to the plane of FIG. 16, and transmits heat from the armature coils 1 to heat radiating members (not shown) disposed at both side portions in the direction of movement.

As in the first embodiment, in the fourteenth embodiment, a structure may also be adopted in which a refrigerant flows within the supporting member 2. In this case, the material having heat-conduction anisotropy 7 covers a refrigerant duct line of the supporting member 2, and is oriented so as to have high thermal conductivity in the direction of the duct line. The duct line is connected at both end portions in the direction of movement by a tube which is flexible to a degree that does not cause a problem in driving of the linear motor.

Fifteenth Embodiment

Figure 17:
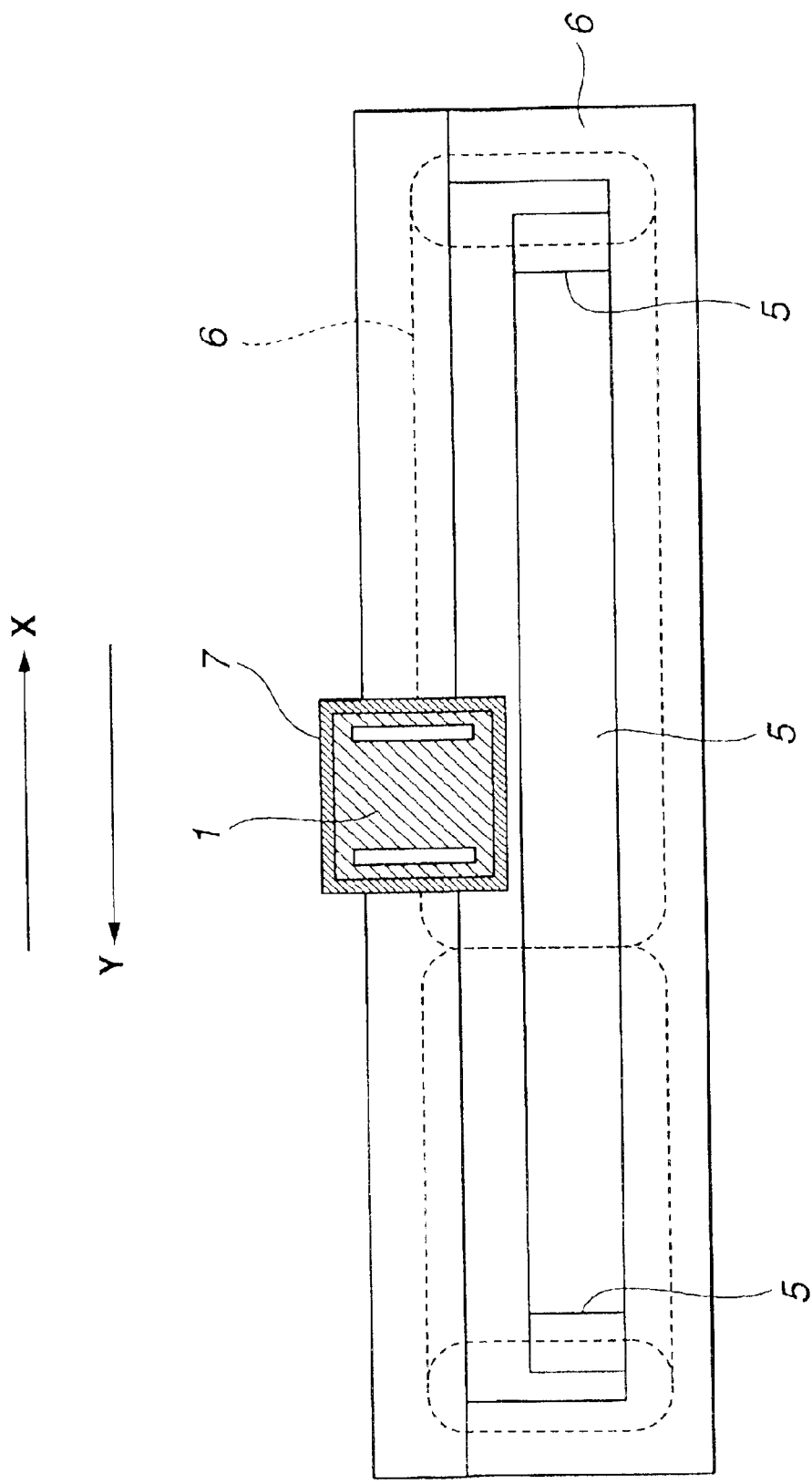
FIG. 17 is a schematic side view, partially in cross-section illustrating a linear motor according to a fifteenth embodiment of the present invention.

FIG. 17 is a schematic diagram illustrating another voice-coil-type linear motor according to a fifteenth embodiment of the present invention. As shown in FIG. 17, the linear motor of the fifteenth embodiment has the same configuration as in the fourteenth embodiment, except that only a single voice coil 1 is provided. The voice coil 1 moves in directions X and Y shown in FIG. 17.

Sixteenth Embodiment

Figure 18:
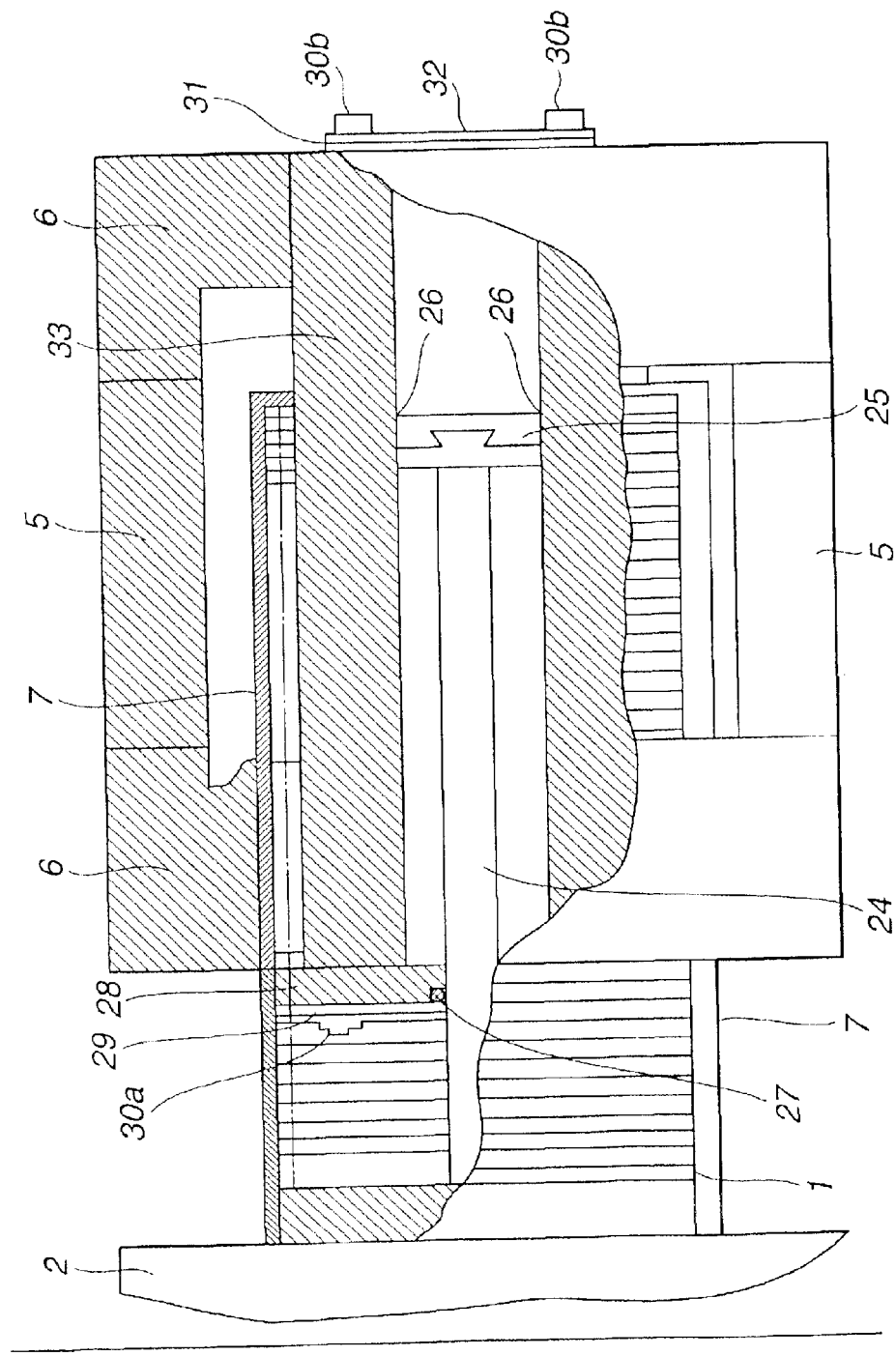
FIG. 18 is a schematic, partially cut-away side view illustrating a linear motor according to a sixteenth embodiment of the present invention.

FIG. 18 is a schematic partial cross-sectional view illustrating still another voice-coil-type linear motor according to a sixteenth embodiment of the present invention. In FIG. 18, there are shown a movable rod 24, a movable-rod slider 25, a gap 26, an O-ring 27, an O-ring supporting plate 28, an O-ring stopping plate 29, screws 30a and 30b, a packing 31, a wear plate 32, and a center pole 33.

The linear motor of the sixteenth embodiment arranges a cylindrical voice coil 1 and induction magnetic poles of a permanent magnet 5 along an axis, and is used, for example, in an apparatus for positioning a read/write head in a recording disk. In the linear motor of the sixteenth embodiment, one end surface of the voice coil 1 formed by cylindrically winding a copper wire is fixed on a supporting member 2. The center pole 33 and the voice coil 1 have the same central axis. The inner surface of the voice coil 1 and the external circumferential surface of the center pole 33 are separated with an appropriate small distance. An effective magnetic flux gap is formed by a yoke 6. The permanent magnet 6 is fixed by being grasped by the yoke 6 from the front side and the rear side, and the center pole 33 is orthogonal to the copper wire of the voice coil 1. The voice coil 1 performs rectilinear movement along its central axis by a current supplied to the voice coil 1 from the outside.

In the linear motor of the sixteenth embodiment, a central portion of the center pole 33 provides a void, where a viscous liquid is sealed. The voice coil 1 and the movable rod 24 are fixed so as to be perpendicular to the supporting member 2 in a state in which the centers of respective cross sections coincide. In accordance with rectilinear movement of the voice coil 1, the movable rod 24 also performs rectilinear movement. At that time, the viscous liquid moves in a direction opposite to the direction of the movement in a gap between the movable-rod slider 25 and the inner surface of the center pole 33, to provide the movable rod 24 with a viscous force proportional to the speed.

A material having heat-conduction anisotropy 7 has high thermal conductivity in the direction of movement of the voice coil 1, and transmits heat from the voice coil 1 to a heat radiating member (not shown) disposed at the supporting member 2.

Seventeenth Embodiment

Figure 19:
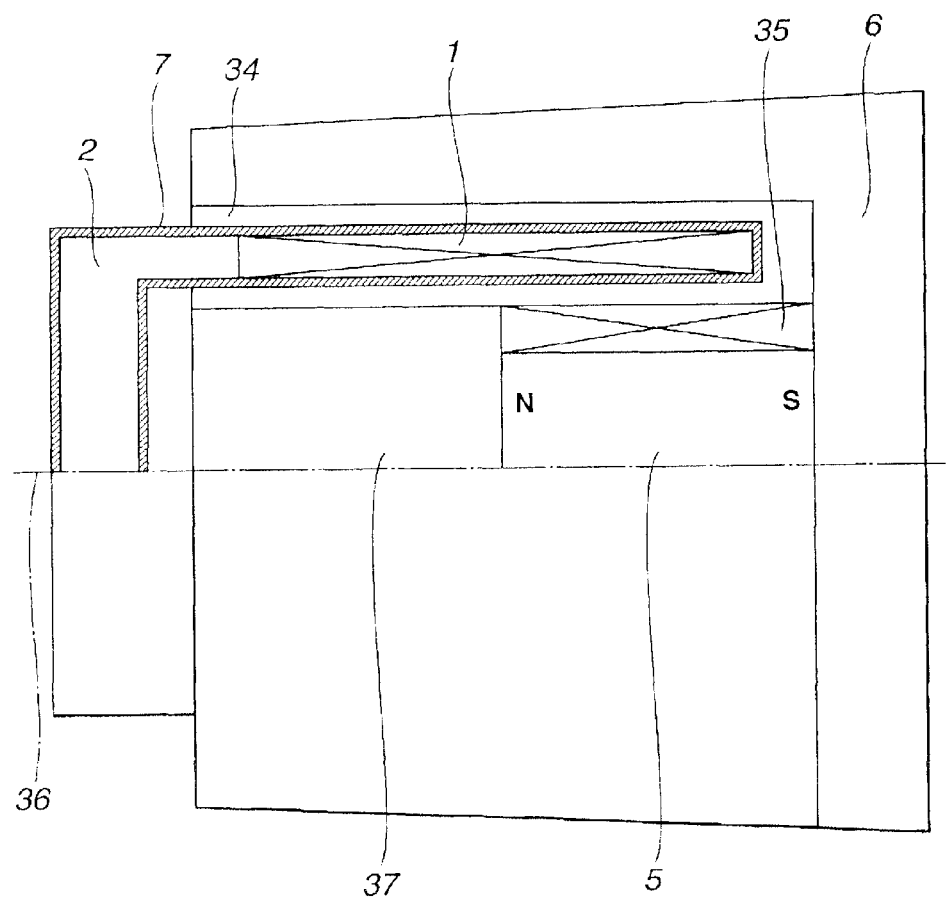
FIG. 19 is a schematic side view illustrating a linear motor according to a seventeenth embodiment of the present invention.

FIG. 19 is a schematic partial cross-sectional view illustrating yet another voice-coil-type linear motor according to a seventeenth embodiment of the present invention. In FIG. 19, there are shown a gap 34, an auxiliary coil 35, a central axis 36, and an induction magnet 37.

As in the above-described sixteenth embodiment, the linear motor of the seventeenth embodiment arranges a permanent magnet 5 and induction magnetic poles of a voice coil 1, serving as an armature, on an axis. The voice coil 1 moves along the central axis 36. In the seventeenth embodiment, the cylindrical permanent magnet 5 is fixed at the center of a cup-shaped yoke 6, and the auxiliary coil 35 is wound around the permanent magnet 5. The cylindrical induction magnet 37 whose cross section is the same as the outer diameter of the auxiliary coil 35 is fixed on the permanent magnet 5. The cup-shaped voice coil 1 is loosely inserted between the inner surface of the cup-shaped yoke 6, and the auxiliary coil 35 and the induction magnet 37 with the predetermined gap 34. The center of each of the cup-shaped yoke 6, the permanent magnet 5, the auxiliary coil 35 and the voice coil 1 coincides with the same axis 36. The auxiliary coil 35 generates a large output in order to drive a driven member having a large load, and is connected to the voice coil 1 and a power supply (not shown) via a diode-bridge circuit so that a current in the same direction flows irrespective of the sign of a voltage applied to the voice coil 1. Thus, the influence of the current flowing in the voice coil 1 on the magnetic field is canceled, to maintain uniformity in the magnetic field in the gap 34. A material having heat-conduction anisotropy 7 and a radiating member for the voice coil 1 of the seventeenth embodiment are the same as in the above-described sixteenth embodiment.

Eighteenth Embodiment

Figure 20:
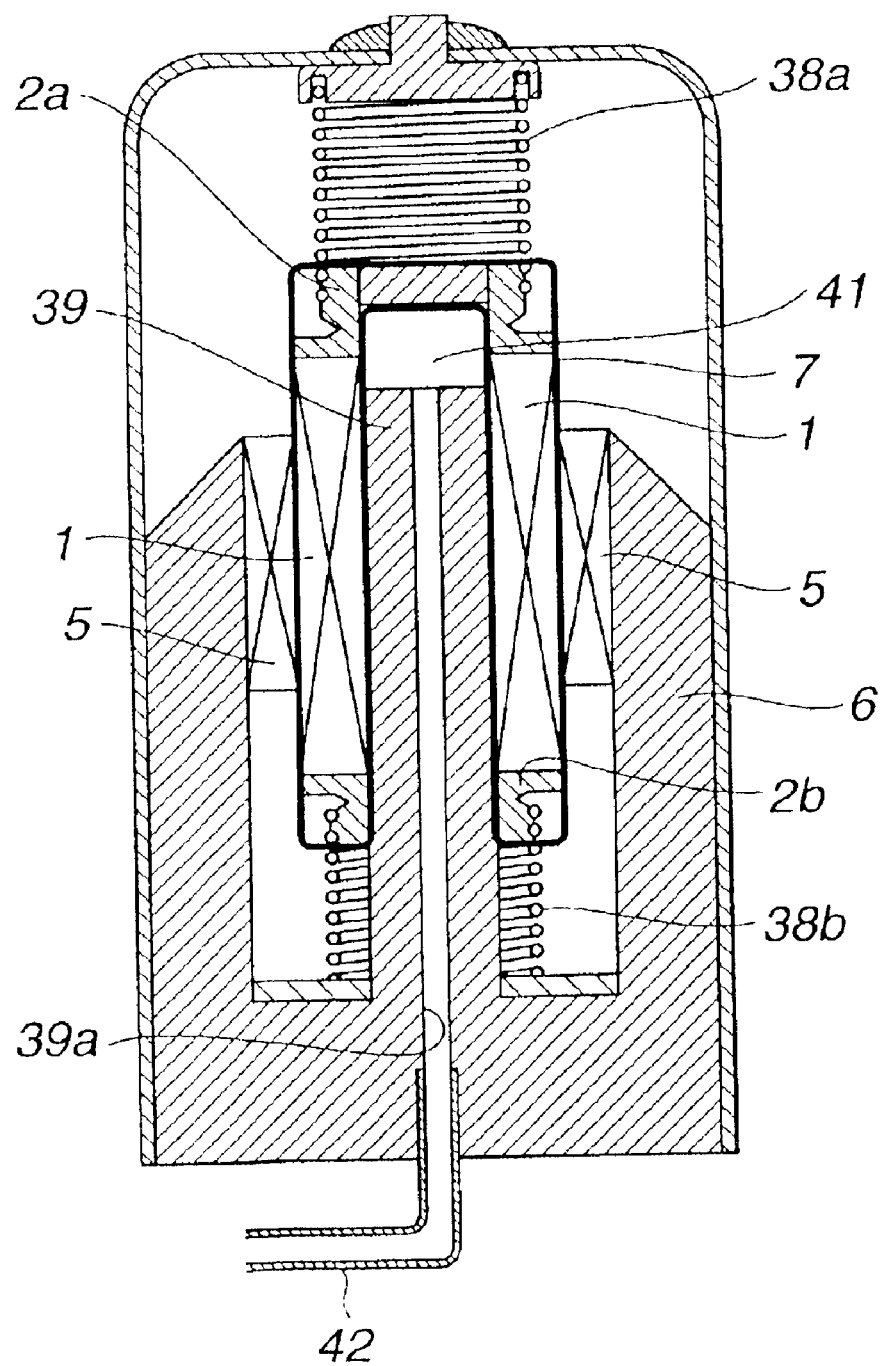
FIG. 20 is a schematic front view illustrating a case in which a linear motor of the present invention is applied to a compressor, according to an eighteenth embodiment of the present invention.

FIG. 20 is a schematic cross-sectional view illustrating a case in which a cup-type voice-coil-type linear motor identical to the one in the sixteenth or seventeenth embodiment is used in a compressor. In FIG. 20, there are shown springs 38a and 38b, and a cylindrical portion 39. A duct line 39a for a compressed substance is cut in the cylindrical portion 39, so that a compression chamber 41 and a tube 42 communicate with each other.

Embodiment of a Semiconductor Exposure Apparatus

Figure 21:
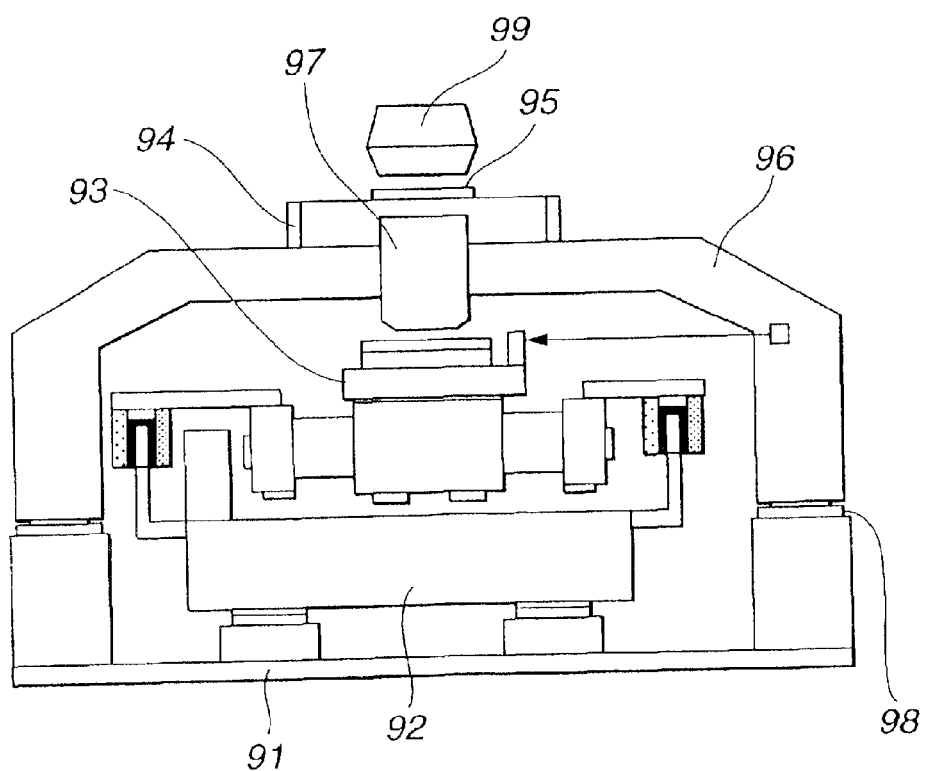
FIG. 21 is a schematic side view illustrating a semiconductor exposure apparatus according to the present invention.

FIG. 21 illustrates a scanning-type exposure apparatus which mounts a stage device using a linear motor according to any one of the above-described embodiments as a driving mechanism, for a wafer stage. A barrel surface plate 96 is supported on a floor or a foundation 91 via dampers 98. The barrel surface plate 96 supports a reticle-stage surface plate 94, as well as a projection optical system 97 positioned between a reticle stage 95 and a wafer stage 93. The wafer stage 93 is supported on a stage surface plate 92 which is supported on the floor or the foundation 91, and mounts and positions a wafer. The reticle stage 95 is supported on a reticle-stage surface plate that is supported on the barrel surface plate 96, and can mount and move a reticle having a circuit pattern formed thereon. Exposure light for exposing the wafer on the wafer stage 93 with the reticle mounted on the reticle stage 95 is generated from an illumination optical system 99. The wafer stage 93 is scanned in synchronization with the reticle stage 95. During scanning of the reticle stage 95 and the wafer stage 93, the positions of the wafer stage 93 and the reticle stage 95 are continuously detected by an interferometer, and are subjected to feedback to respective driving units for the reticle stage 95 and the wafer stage 93. It is thereby possible to exactly synchronize respective positions to start scanning of the reticle stage 95 and the wafer stage 93, and very precisely control a scanning speed in a constant-speed scanning region. While the reticle stage 95 and the wafer stage 93 are scanned by the projection optical system 97, the wafer is exposed with the pattern of the reticle, so that a circuit pattern is transferred.

Embodiment of a Semiconductor Production System

Next, a system for producing semiconductor devices (semiconductor chips of ICs (integrated circuits), LSIs (large-scale integrated circuits) or the like, liquid-crystal panels, CCDs (charge-coupled devices), thin-film magnetic heads, micro-machines, or the like) will be described. In this system, troubleshooting or periodic maintenance of each manufacturing apparatus installed in a semiconductor manufacturing factory, or maintenance service, such as provision of software, or the like, is performed utilizing a computer network provided outside of the factory.

Figure 22:
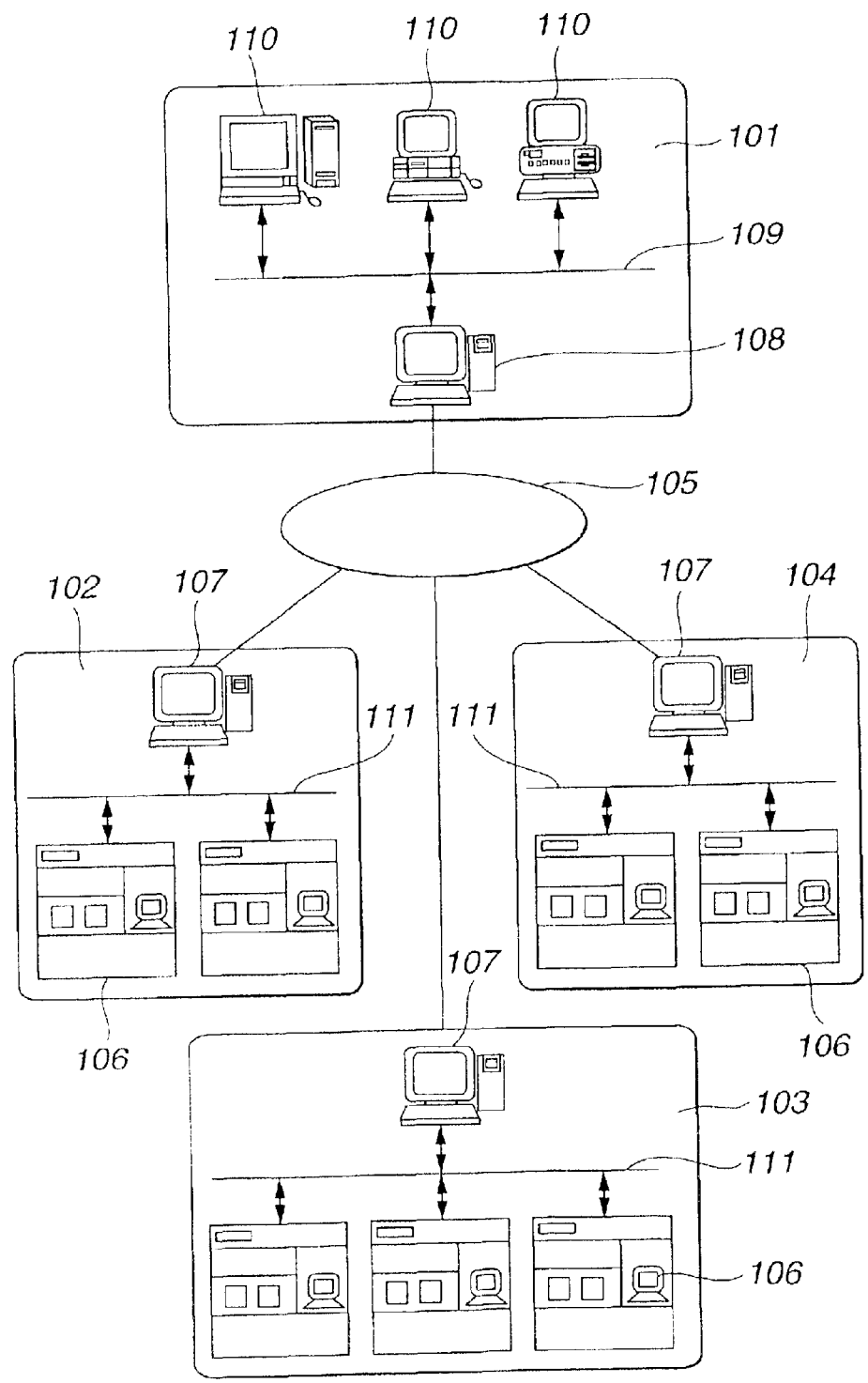
FIG. 22 is a schematic diagram illustrating a semiconductor-device production system, as seen from an angle.

FIG. 22 illustrates the entirety of the system, as seen from a certain angle. In FIG. 22, reference numeral 101 represents a business center of a vender (an apparatus supply maker) that provides apparatuses for manufacturing semiconductor devices. As examples of manufacturing apparatuses, semiconductor manufacturing apparatuses for respective processes, such as apparatuses for preprocessing (exposure apparatuses, resist process apparatuses, lithography apparatuses, such as etching apparatuses or the like, heat treatment apparatuses, film forming apparatuses, flattening apparatuses and the like) and apparatuses for postprocessing (assembling apparatuses, inspection apparatuses and the like) are assumed. The business center 101 includes a host management system 108 that provides maintenance databases for manufacturing apparatuses, a plurality of operation terminal computers 110, and a local area network (LAN) 109 that forms an intranet by connecting the above-described items. The host management system 108 includes a gateway for connecting the LAN 109 to the Internet 105, serving as an external network of the business center 101, and a security function for limiting access from the outside.

Each of manufacturing factories 102–104 of at least one semiconductor maker serves as a user of the manufacturing apparatuses. The manufacturing factories 102–104 may belong to different makers, or the same maker (for example, factories for preprocessing, factories for postprocessing, and the like). Each of the factories 102–104 includes a plurality of manufacturing apparatuses 106, a local area network (LAN) 111 that forms an intranet by connecting the apparatuses 106, and a host management system 107, which serves as a monitoring apparatus for monitoring the state of operation of each of the manufacturing apparatuses 106. The host management system 107 provided in each of the factories 102–104 includes a gateway for connecting the LAN 111 to the Internet, which serves as an external network of the factory. Thus, it is possible to access the host management system 108 at the vender 101 from the LAN 111 of each of the factories 102–104 via the Internet 105, and only a user limited by the security function of the host management system 108 is allowed to perform accessing. More specifically, it is possible to notify status information indicating the state of operation of each of the manufacturing apparatuses 106 (for example, the symptoms of a manufacturing apparatus in which a trouble has occurred) from the factory to the vender, and receive maintenance information, such as response information corresponding to the notification (for example, information instructing countermeasures for the trouble, or software and data for the countermeasures), latest software, help information and the like, from the vender side, via the Internet 105. For data communication between each of the factories 102–104 and the vender 101 and data communication via the LAN 111 in each of the factories 102–104, a communication protocol (TCP/IP (Transmission Control Protocol/Internet Protocol)) generally used in the Internet is used. Instead of utilizing the Internet as an external network provided outside of each factory, a dedicated-line network (such as ISDN (Integrated Services Digital Network) or the like) having high security that cannot be accessed from a third party can also be utilized. The host management system is not always provided by the vender. For example, the user may construct a database and provide the database on an external network, and access to the database from a plurality of factories of the user may be permitted.

Figure 23:
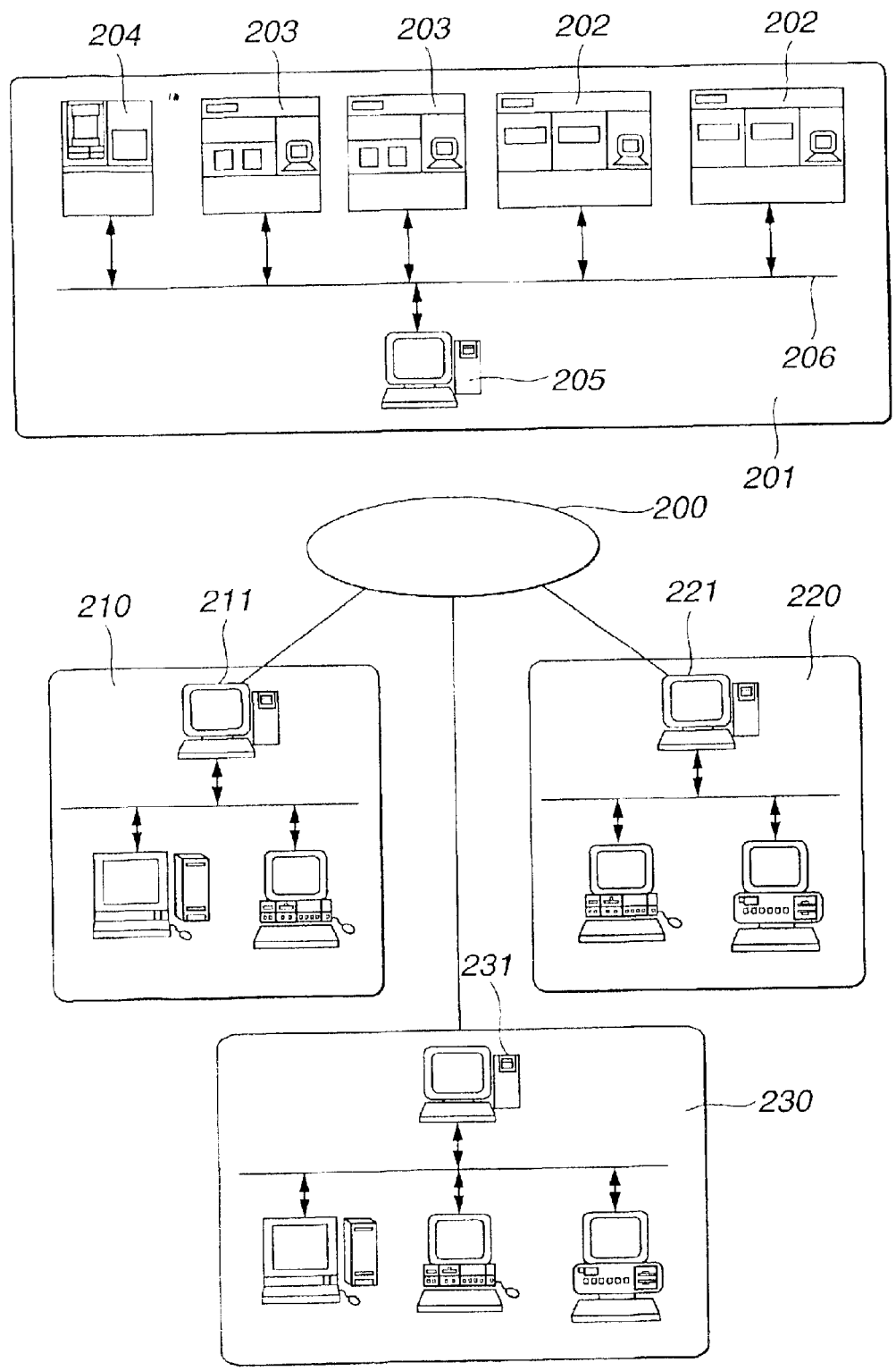
FIG. 23 is a schematic diagram illustrating the semiconductor-device production system shown in FIG. 22, as seen from another angle.

FIG. 23 is a schematic diagram illustrating the entirety of the above-described system, as seen from an angle different from the angle in FIG. 22. In the above-described case, a plurality of user factories, each including manufacturing apparatuses, and a management system of a vender of the manufacturing apparatuses are connected via an external network, and information relating to production management of each factory and information relating to at least one manufacturing apparatus are subjected to data communication via the external network. In this example, however, a factory including manufacturing apparatuses of a plurality of venders, and the management system of each of the venders of the manufacturing apparatuses are connected via an external network provided outside of the factory, and maintenance information relating to each of the manufacturing apparatuses is subjected to data communication. In FIG. 23, reference numeral 201 represents a manufacturing factory of a manufacturing-apparatus user (a semiconductor-device manufacturer). In a production line of the factory 201, manufacturing apparatuses for performing various processes, i.e., exposure apparatuses 202, resist process apparatuses 203, and a film forming apparatus 204 are installed. In FIG. 23, only one manufacturing factory 20 is depicted. Actually, however, a plurality of factories are connected via a network. Each apparatus within the factory 201 is connected via a LAN 206 to provide an intranet, and operations of the production line are managed by a host management system 205. In respective business centers of venders, such as an exposure-apparatus maker 210, a resist-process-apparatus maker 220 and a film-forming-apparatus maker 230, host management systems 211, 221 and 231, respectively, perform remote maintenance for supplied apparatuses. As described above, each of the business centers includes a maintenance database and a gateway of an external network. The host management system 205 for managing respective apparatuses within the user's manufacturing factory, and the management systems 211, 221 and 231 of the respective apparatus venders are connected via the Internet or a dedicated-line network, serving as an external network 200. In this system, if trouble occurs in any one of a series of manufacturing apparatuses of the production line, the operation of the production line is interrupted. However, by receiving remote maintenance via the Internet 200 from the vender of the apparatus having the trouble, it is possible to perform a prompt countermeasure, and minimize a break in the production line.

Each manufacturing apparatus installed in the semiconductor manufacturing factory includes a display, a network interface, software for network access stored in a storage device, and a computer for executing software for operating the apparatus. An incorporated memory, a hard disk, a network file server or the like may be used as the storage device. The software for network access includes a dedicated or general-purpose web browser, and provides a user interface having, for example, a picture frame shown in FIG. 24, on the display. An operator managing a manufacturing apparatus at the factory inputs information relating to the type 401, the serial number 402, the item name of the trouble 403, the date of generation 404, urgency 405, the symptom 406, countermeasures 407, the progress 408 and the like of the manufacturing apparatus in input items on the picture frame. The input information is transmitted to the maintenance database via the Internet, and appropriate maintenance information corresponding to the transmitted information is transmitted from the maintenance database and is displayed on the display. The user interface provided by the Web browser also realizes hyperlink functions 410–412 as shown in FIG. 24. The operator can access further detailed information relating to each item, obtain latest-version software used for the manufacturing apparatus from a software library provided by the vender, and obtain an operational guide (help information) to be utilized by the operator. The maintenance information provided from the maintenance database includes information relating to the above-described features of the present invention, and the software library also provides the latest software for realizing the features of the present invention.

Figure 25:
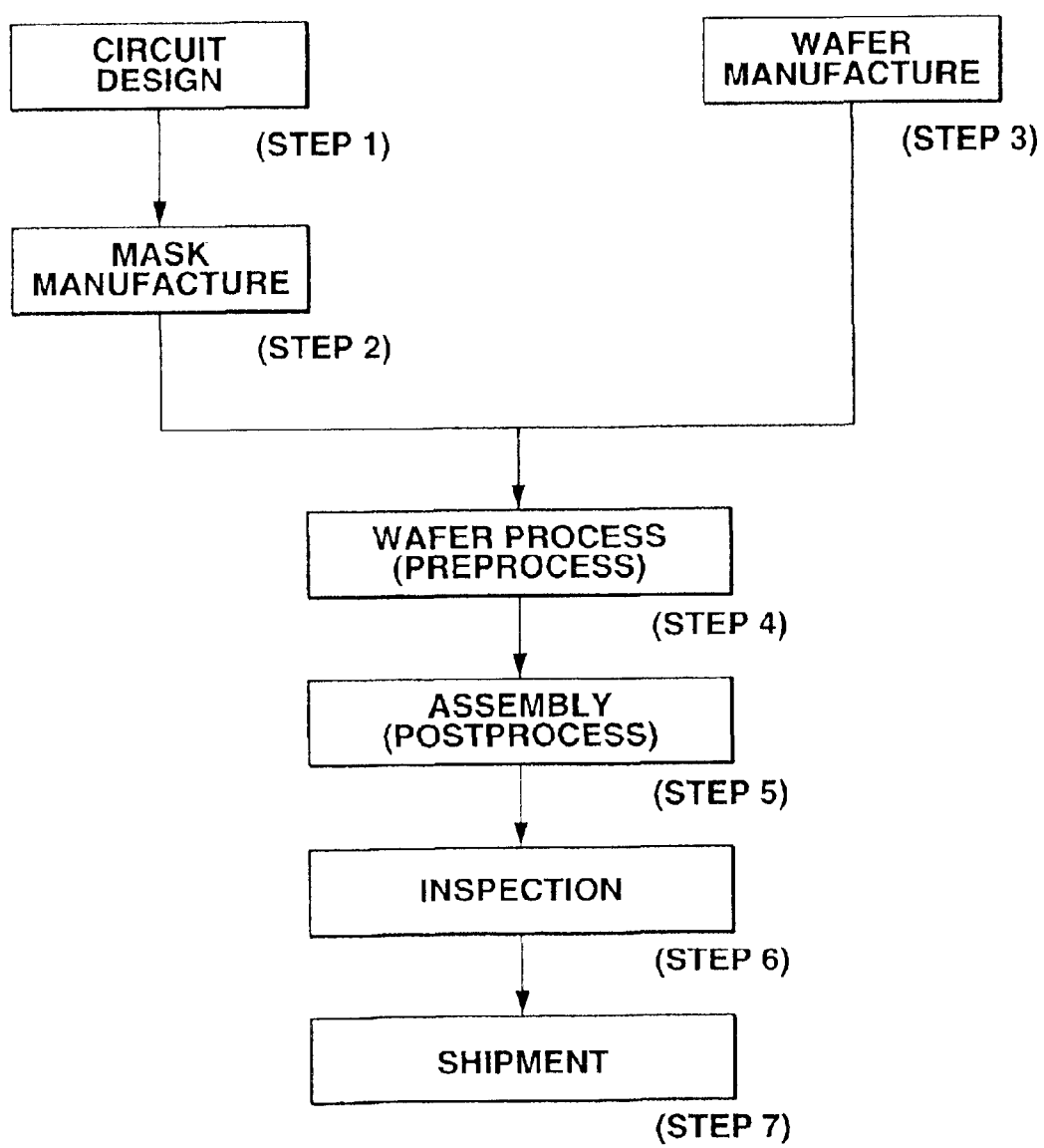
FIG. 25 is a flowchart illustrating the flow of a device manufacturing process.

Next, a process for manufacturing semiconductor devices that utilizes the above-described production system will be described. FIG. 25 illustrates the flow of the entire process for manufacturing semiconductor devices. In step 1 (circuit design), circuit design of semiconductor devices is performed. In step 2 (mask manufacture), mask, on which designed circuit patterns are formed, are manufactured. In step 3 (wafer manufacture), wafers are manufactured using a material, such as silicon or the like. Step 4 (wafer process) is called a preprocess, in which actual circuits are formed on the wafers by means of photolithography using the above-described masks and wafers. The next step 5 (assembly) is called a postprocess which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests and the like, of the semiconductor devices manufactured in step 5 is performed. The manufacture of the semiconductor devices is completed after passing through the above-described processes, and the manufactured devices are shipped (step 7). The preprocess and the postprocess are performed in separate dedicated factories, and maintenance is performed by the above-described remote maintenance system at each of these factories. Between the preprocess factory and the postprocess factory, information for production control and apparatus maintenance is subjected to data communication via the Internet or the dedicated-line network.

Figure 26:
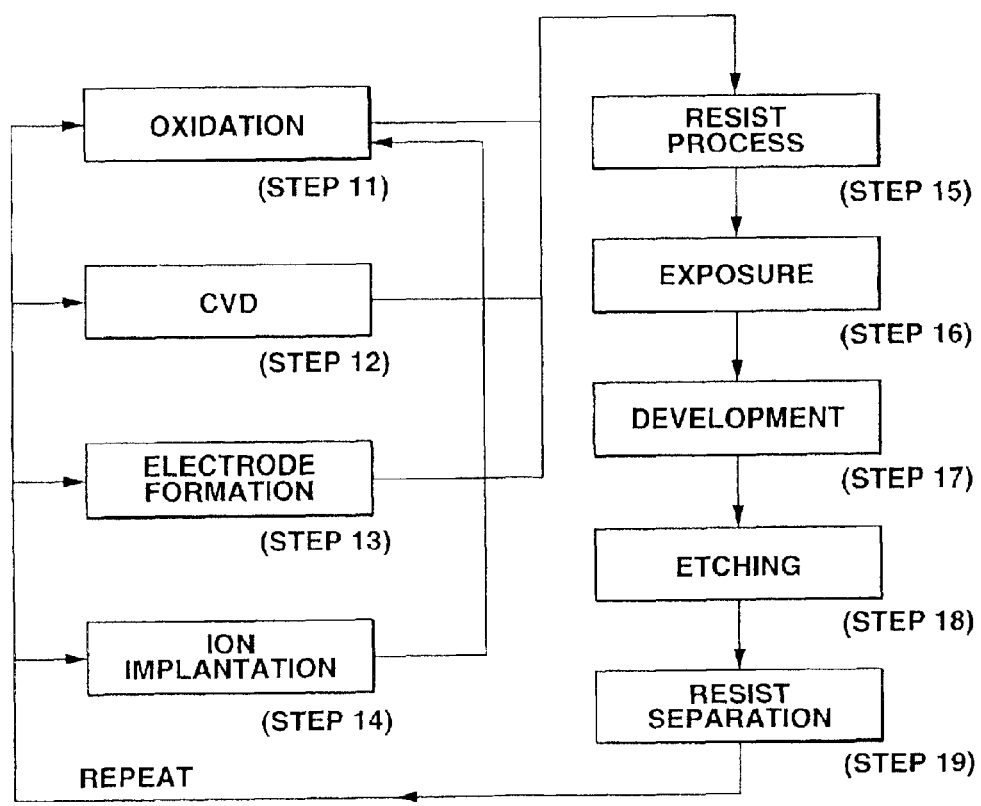
FIG. 26 is a flowchart illustrating a wafer process.

FIG. 26 illustrates the detailed flow of the above-described wafer process. In step 11 (oxidation), the surface of the wafer is oxidized. In step 12 (CVD (chemical vapor deposition)), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material (resist) is coated on the wafer. In step 16 (exposure), the circuit pattern on the mask is exposed and printed on the wafer using the above-described exposure apparatus. In step 17 (development), the exposed wafer is developed. In step 18 (etching), portions other than the developed resist image are etched off. In step 19 (resist separation), the resist, which becomes unnecessary after the completion of the etching, is removed. By repeating these steps, a final circuit pattern made of multiple patterns is formed on the wafer. Since manufacturing apparatuses used in the respective processes are subjected to maintenance by the remote maintenance system, it is possible to prevent troubles. Even if a trouble occurs, it is possible to promptly recover the process, and improve productivity in manufacture of semiconductor devices than in the conventional approach.

In the linear motors and the electromagnetic actuators according to the present invention, it is possible to suppress an increase in the surface temperature of an armature coil in the linear motor, and increase the thrust of the linear motor in the condition of a constant surface temperature.

The individual components shown in outline in the drawings are all well known in the electronic actuator and exposure apparatus arts and their specific construction and operation are not critical to the operation or the best mode for carrying out the invention.

As many apparently widely different embodiments of the present invention can be made without departing from the spirit and scope thereof, it is to be understood that the invention is not limited to the specific embodiments thereof as defined in the appended claims.

What is claimed is:

1. An electromagnetic actuator comprising:
a permanent magnet;
an armature coil for performing relative movement with respect to said permanent magnet;
a material having heat-conduction anisotropy that surrounds said armature coil, said material having a thermal conductivity in the lateral direction greater than a thermal conductivity in the longitudinal direction; and
a heat radiating member coupled to the heat-conduction anisotropic material for radiating heat generated by said armature coil.

2. An electromagnetic actuator according to claim 1, wherein said material having heat-conduction anisotropy is oriented so as to guide the heat generated from said armature coil to said heat radiating member.

3. An electromagnetic actuator according to claim 1, further comprising a material whose thermal conductivity is lower than thermal conductivity of said material having heat-conduction anisotropy in a direction of thickness, between said material having heat-conduction anisotropy and said armature coil.

4. An electromagnetic actuator according to claim 1, wherein said material having heat-conduction anisotropy comprises a material having a smaller eddy-current loss than a metal.

5. An electromagnetic actuator according to claim 1, wherein said material having heat-conduction anisotropy comprises a graphite sheet.

6. An electromagnetic actuator according to claim 1, wherein said material having heat-conduction anisotropy is put in tight contact with said heat radiating member by an adhesive whose thermal conductivity is higher than thermal conductivity of said material having heat-conduction anisotropy in a direction of thickness.

7. An electromagnetic actuator according to claim 1, wherein said heat radiating member is connected to cooling means provided outside of said electromagnetic actuator, so as to conduct the heat to said cooling means.

8. An electromagnetic actuator according to claim 1, wherein said heat radiating member comprises a heat radiating plate.

9. An electromagnetic actuator according to claim 1, wherein said heat radiating member comprises a duct line having a refrigerant therewithin.

10. An electromagnetic actuator according to claim 9, wherein an inner-wall material of said duct line comprises a nonmagnetic material.

11. An electromagnetic actuator according to claim 9, wherein said material having heat-conduction anisotropy contacts the refrigerant flowing within said duct line.

12. An electromagnetic actuator according to claim 1, further comprising a supporting member for supporting said armature coil.

13. An electromagnetic actuator according to claim 12, wherein heat conductivity of said supporting member is 200–400 W/m K.

14. An electromagnetic actuator according to claim 12, wherein said material having heat-conduction anisotropy is put in tight contact with a surface of said supporting member by an adhesive whose thermal conductivity is higher than thermal conductivity of said material having heat-conduction anisotropy in a direction of thickness.

15. An electromagnetic actuator according to claim 12, wherein said supporting member comprises a pair of bar-shaped members extending in a direction of movement and fixed parallel to each other, and said armature coil is supported by grasping of said armature coil between the pair of bar-shaped members.

16. An electromagnetic actuator according to claim 12, wherein a duct line having a refrigerant flowing therewithin passes within said supporting member.

17. An electromagnetic actuator according to claim 16, wherein an inner-wall material of said duct line has thermal conductivity higher than thermal conductivity of said supporting member.

18. An exposure apparatus for exposing a substrate with a pattern of an original plate, said apparatus comprising:
    a stage for moving the original plate or the substrate, said stage comprising:
    a permanent magnet;
    an armature coil capable of performing relative movement with respect to said permanent magnet;
    a material having heat-conduction anisotropy that surrounds said armature coil, said material having a thermal conductivity in the lateral direction greater than a thermal conductivity in the longitudinal direction; and
    a heat radiating member coupled to said heat-conduction anisotropic material for radiating heat generated by said armature coil.

19. A device manufacturing method comprising:
    a step of installing a group of manufacturing apparatuses for respective processes inclusive of said exposure apparatus according to claim 18 in a device manufacturing factory; and
    a step of manufacturing a device according to a plurality of processes using the group of manufacturing apparatuses.

20. A device manufacturing method according to claim 19, further comprising:
    a step of performing manufacturing by the group of manufacturing apparatuses through a local area network; and
    a step of performing data communication of information relating to at least one of the group of manufacturing apparatuses between the local area network and an external network provided outside of the device manufacturing factory.

21. A device manufacturing method according to claim 20, further comprising a step of obtaining maintenance information relating to the at least one of the group of manufacturing apparatuses according to data communication by accessing a database provided by a vender or a user of said exposure apparatus, via the external network.

22. A device manufacturing method according to claim 21, further comprising a step of performing production management according to data communication between the device manufacturing factory and another device manufacturing factory via the external network.

23. A device manufacturing factory comprising:
    a group of manufacturing apparatuses for respective processes inclusive of said exposure apparatus according to claim 18;
    a local area network connecting said group of manufacturing apparatuses; and
    a gateway for allowing access from said local area network to an external network provided outside of said factory,
    wherein data communication of information relating to at least one of said group of manufacturing apparatuses is allowed.

24. A method for performing maintenance of said exposure apparatus according to claim 18 installed in a device manufacturing factory, said method comprising:
    a step of providing a maintenance database connected to an external network of the device manufacturing factory from a vender or a user of said exposure apparatus;
    a step of permitting access to the maintenance database from the device manufacturing factory via the external network; and
    a step of transmitting maintenance information accumulated in the maintenance database to the device manufacturing factory via the external network.

25. An exposure apparatus according to claim 18, further comprising:
    a display;
    a network interface; and
    a computer for executing software for a network,
    wherein maintenance information relating to said exposure apparatus can be subjected to data communication via a computer network.

26. An exposure apparatus according to claim 25, wherein the software for a network allows connecting said computer to an external network provided outside of a factory where said exposure apparatus is installed, providing a user interface for accessing a maintenance database provided by a vender or a user of said exposure apparatus on said display, and obtaining information from the database via the external network.

* * * * *

UNITED STATES PATENT AND TRADEMARK OFFICE
CERTIFICATE OF CORRECTION

PATENT NO. : 6,847,132 B2
DATED : January 25, 2005
INVENTOR(S) : Takao Ukaji

It is certified that error appears in the above-identified patent and that said Letters Patent is hereby corrected as shown below:

<u>Title page,</u>
Item [56], References Cited, FOREIGN PATENT DOCUMENTS, "11027927 A" should read -- 11-27927 A --; "2001327152 A" should read -- 2001-327152 A --; and "2002238238 A" should read -- 2002-238238 A --.

<u>Column 3,</u>
Line 11, "intension" should read -- intention --.

<u>Column 4,</u>
Line 8, "200-400 W/m K." should read -- 200-400 W/m·K. --.

<u>Column 14,</u>
Line 35, "ling" should read -- long --.

<u>Column 17,</u>
Line 58, "are" should read -- is --.

<u>Column 20,</u>
Line 52, "200-400 W/m K." should read -- 200-400 W/m·K. --.

Signed and Sealed this

Thirty-first Day of May, 2005

JON W. DUDAS
*Director of the United States Patent and Trademark Office*